US009496419B2

(12) United States Patent
Sharangpani et al.

(10) Patent No.: US 9,496,419 B2
(45) Date of Patent: Nov. 15, 2016

(54) RUTHENIUM NUCLEATION LAYER FOR CONTROL GATE ELECTRODES IN A MEMORY STRUCTURE

(71) Applicant: SanDisk Technologies, Inc., Plano, TX (US)

(72) Inventors: Rahul Sharangpani, Fremont, CA (US); Raghuveer S. Makala, Campbell, CA (US); Sateesh Koka, Milpitas, CA (US); George Matamis, Danville, CA (US)

(73) Assignee: SANDISK TECHNOLOGIES LLC, Plano, TX (US)

( * ) Notice: Subject to any disclaimer, the term of this patent is extended or adjusted under 35 U.S.C. 154(b) by 0 days.

(21) Appl. No.: 14/553,124

(22) Filed: Nov. 25, 2014

(65) Prior Publication Data

US 2016/0149049 A1    May 26, 2016

(51) Int. Cl.
| | | |
|---|---|---|
| H01L 27/115 | (2006.01) | |
| H01L 29/788 | (2006.01) | |
| H01L 29/792 | (2006.01) | |

(52) U.S. Cl.
CPC ..... *H01L 29/7889* (2013.01); *H01L 27/11519* (2013.01); *H01L 27/11531* (2013.01); *H01L 27/11548* (2013.01); *H01L 27/11556* (2013.01); *H01L 27/11565* (2013.01); *H01L 27/11573* (2013.01); *H01L 27/11575* (2013.01); *H01L 27/11582* (2013.01); *H01L 29/7926* (2013.01)

(58) Field of Classification Search
CPC .................. H01L 27/11551; H01L 27/11556
See application file for complete search history.

(56) References Cited

U.S. PATENT DOCUMENTS

| | | | |
|---|---|---|---|
| 5,084,417 | A | 1/1992 | Joshi et al. |
| 5,807,788 | A | 9/1998 | Brodsky et al. |
| 5,915,167 | A | 6/1999 | Leedy |
| 7,177,191 | B2 | 2/2007 | Fasoli et al. |
| 7,221,588 | B2 | 5/2007 | Fasoli et al. |
| 7,233,522 | B2 | 6/2007 | Chen et al. |
| 7,514,321 | B2 | 4/2009 | Mokhlesi et al. |
| 7,575,973 | B2 | 8/2009 | Mokhlesi et al. |

(Continued)

FOREIGN PATENT DOCUMENTS

WO    WO02/15277 A2    2/2002

OTHER PUBLICATIONS

Endoh et al., "Novel Ultra High Density Memory with a Stacked-Surrounding Gate Transistor (S-SGT) Structured Cell," IEDM Proc. (2001) 33-36.

(Continued)

*Primary Examiner* — Daniel Whalen
(74) *Attorney, Agent, or Firm* — The Marbury Law Group PLLC

(57) ABSTRACT

A memory film and a semiconductor channel can be formed within each memory opening that extends through a stack including an alternating plurality of insulator layers and sacrificial material layers. After formation of backside recesses through removal of the sacrificial material layers selective to the insulator layers, a ruthenium portion can be formed in each backside recess, and a polycrystalline conductive material portion can be formed on each ruthenium portion. Each ruthenium portion can be employed in lieu of a tungsten seed layer to function as a lower resistivity seed layer that enables subsequent deposition of a polycrystalline conductive material. The resulting electrically conductive lines can have a lower resistivity than conductive lines of comparable dimensions that employ tungsten seed layers.

30 Claims, 21 Drawing Sheets

(56) References Cited

U.S. PATENT DOCUMENTS

| | | | |
|---|---|---|---|
| 7,691,442 | B2 | 4/2010 | Gandikota et al. |
| 7,745,265 | B2 | 6/2010 | Mokhlesi et al. |
| 7,745,312 | B2 | 6/2010 | Herner et al. |
| 7,808,038 | B2 | 10/2010 | Mokhlesi et al. |
| 7,848,145 | B2 | 12/2010 | Mokhlesi et al. |
| 7,851,851 | B2 | 12/2010 | Mokhlesi et al. |
| 8,008,710 | B2 | 8/2011 | Fukuzumi |
| 8,053,829 | B2 | 11/2011 | Kang et al. |
| 8,187,936 | B2 | 5/2012 | Alsmeier et al. |
| 8,193,054 | B2 | 6/2012 | Alsmeier |
| 8,198,672 | B2 | 6/2012 | Alsmeier |
| 8,283,228 | B2 | 10/2012 | Alsmeier |
| 8,349,681 | B2 | 1/2013 | Alsmeier et al. |
| 8,445,347 | B2 | 5/2013 | Alsmeier |
| 8,461,000 | B2 | 6/2013 | Alsmeier et al. |
| 8,580,639 | B2 | 11/2013 | Alsmeier et al. |
| 8,765,543 | B2 | 7/2014 | Alsmeier et al. |
| 2007/0210338 | A1 | 9/2007 | Orlowski |
| 2007/0252201 | A1 | 11/2007 | Kito et al. |
| 2009/0142474 | A1* | 6/2009 | Gandikota .......... C23C 16/0281 427/58 |
| 2010/0044778 | A1 | 2/2010 | Seol |
| 2010/0112769 | A1 | 5/2010 | Son et al. |
| 2010/0120214 | A1 | 5/2010 | Park et al. |
| 2010/0155810 | A1 | 6/2010 | Kim et al. |
| 2010/0155818 | A1 | 6/2010 | Cho |
| 2010/0181610 | A1 | 7/2010 | Kim et al. |
| 2010/0207195 | A1 | 8/2010 | Fukuzumi et al. |
| 2010/0320528 | A1 | 12/2010 | Jeong et al. |
| 2011/0076819 | A1 | 3/2011 | Kim et al. |
| 2011/0133606 | A1 | 6/2011 | Yoshida et al. |
| 2011/0266606 | A1 | 11/2011 | Park et al. |
| 2012/0001247 | A1 | 1/2012 | Alsmeier |
| 2012/0001249 | A1 | 1/2012 | Alsmeier |
| 2012/0256247 | A1* | 10/2012 | Alsmeier .............. H01L 21/764 257/319 |
| 2013/0248974 | A1 | 9/2013 | Alsmeier et al. |
| 2013/0264631 | A1 | 10/2013 | Alsmeier et al. |
| 2013/0313627 | A1 | 11/2013 | Lee et al. |
| 2014/0008714 | A1 | 1/2014 | Makala et al. |
| 2014/0131787 | A1 | 5/2014 | Alsmeier |
| 2014/0175530 | A1 | 6/2014 | Chien et al. |
| 2014/0225181 | A1 | 8/2014 | Makala et al. |
| 2015/0200203 | A1* | 7/2015 | Jang ................... H01L 27/11582 257/324 |
| 2015/0364485 | A1* | 12/2015 | Shimura ........... H01L 27/11556 257/316 |

OTHER PUBLICATIONS

U.S. Appl. No. 14/133,979, filed Dec. 19, 2013, SanDisk Technologies Inc.

U.S. Appl. No. 14/225,116, filed Mar. 25, 2014, SanDisk Technologies Inc.

U.S. Appl. No. 14/225,176, filed Mar. 25, 2014, SanDisk Technologies Inc.

Jang et al., "Vertical Cell Array Using TCAT (Terabit Cell Array Transistor) Technology for Ultra High Density NAND Flash Memory," 2009 Symposium on VLSI Technology Digest of Technical Papers, pp. 192-193.

Katsumata et al., "Pipe-Shaped BiCS Flash Memory with 16 Stacked Layers and Multi-Level-Cell Operation for Ultra High Density Storage Devices," 2009 Symposium on VLSI Technology Digest of Technical Papers, pp. 136-137.

Maeda et al., "Multi-Stacked 1G Cell/Layer Pipe-Shaped BiCS Flash Memory," 2009 Symposium on VLSI Technology Digest of Technical Papers, pp. 22-23.

Tanaka et al., "Bit-Cost Scalable Technology for Low-Cost and Ultrahigh-Density Flash Memory," Toshiba Review, vol. 63, No. 2, 2008, pp. 28-31.

Masahide Kimura, "3D Cells Make Terabit NAND Flash Possible," Nikkei Electronics Asia, Sep. 17, 2009, 6pgs.

International Search Report & Written Opinion, PCT/US2011/042566, Jan. 17, 2012.

Invitation to Pay Additional Fees & Partial International Search Report, PCT/US2011/042566, Sep. 28, 2011.

Jang et al., "Memory Properties of Nickel Silicide Nanocrystal Layer for Possible Application to Nonvolatile Memory Devices," IEEE Transactions on Electron Devices, vol. 56, No. 12, Dec. 2009.

Chen et al., "Reliability Characteristics of NiSi Nanocrystals Embedded in Oxide and Nitride Layers for Nonvolatile Memory Application," Applied Physics Letters 92, 152114 (2008).

J. Ooshita, Toshiba Announces 32Gb 3D-Stacked Multi-Level NAND Flash, 3 pages, http://techon.nikkeibp.co.jp/english/NEWS_EN/20090619/171977/ Nikkei Microdevices, Tech-On, Jun. 19, 2009.

Wang et al., "Low Temperature Silicon Selective Epitaxial Growth (SEG) and Phosphorous Doping in a Reduced-Pressure Pancake Reactor", ECE Technical Reports, Paper 299 (Apr. 1, 1992).

Whang et al., "Novel 3-Dimensional Dual Control-Gate with Surrounding Floating-Gate (DC-SF) NAND Flash Cell for 1Tb File Storage Application", IEDM-2010 Proceedings, Dec. 6-8, 2010, pp. 668-671.

Lim et al., "The Effect of CF4 Addition on Ru Etching with Inductively Coupled Plasma," Journal of the Korean Physical Society, vol. 42, Feb. 2003.

Lee et al., "Reactive Ion Etching Mechanism of $RuO_2$ Thin Films in Oxygen Plasma with the Addition of $CF_4$, $Cl_2$, and $N_2$," Abstract from 1998 Jpn. J. Appl. Phys. 37 2634.

Yunogami et al., "Anisotropic Etching of $RuO_2$ and Ru with High Aspect Ratio for Gigabit Dynamic Random Access Memory," Abstract from J. Vac. Sci. Technol. B 18, 1911 (2000).

Elam et al., "Nucleation and Growth During Tungsten Atomic Layer Deposition on $SiO_2$ Surfaces," Thin Solid Films, 386 (2001) pp. 41-52.

Park et al., "Thermal and Plasma Enhanced Atomic Layer Deposition Ruthenium and Electrical Characterization as a Metal Electrode," Microelectronic Engineering 85 (2008) pp. 39-44.

R. Abermann, "Measurements of the Intrinsic Stress in Thin Metal Flims," Vacuum vol. 41, Nos. 4-6, pp. 1279-1282, 1990.

U.S. Appl. No. 14/314,370, filed Jun. 25, 2014, SanDisk Technologies Inc.

U.S. Appl. No. 14/464,480, filed Aug. 20, 2014, SanDisk Technologies Inc.

U.S. Appl. No. 14/553,207, filed Nov. 25, 2014, SanDisk Technologies Inc.

U.S. Appl. No. 14/533,149, filed Nov. 25, 2014, SanDisk Technologies Inc.

\* cited by examiner

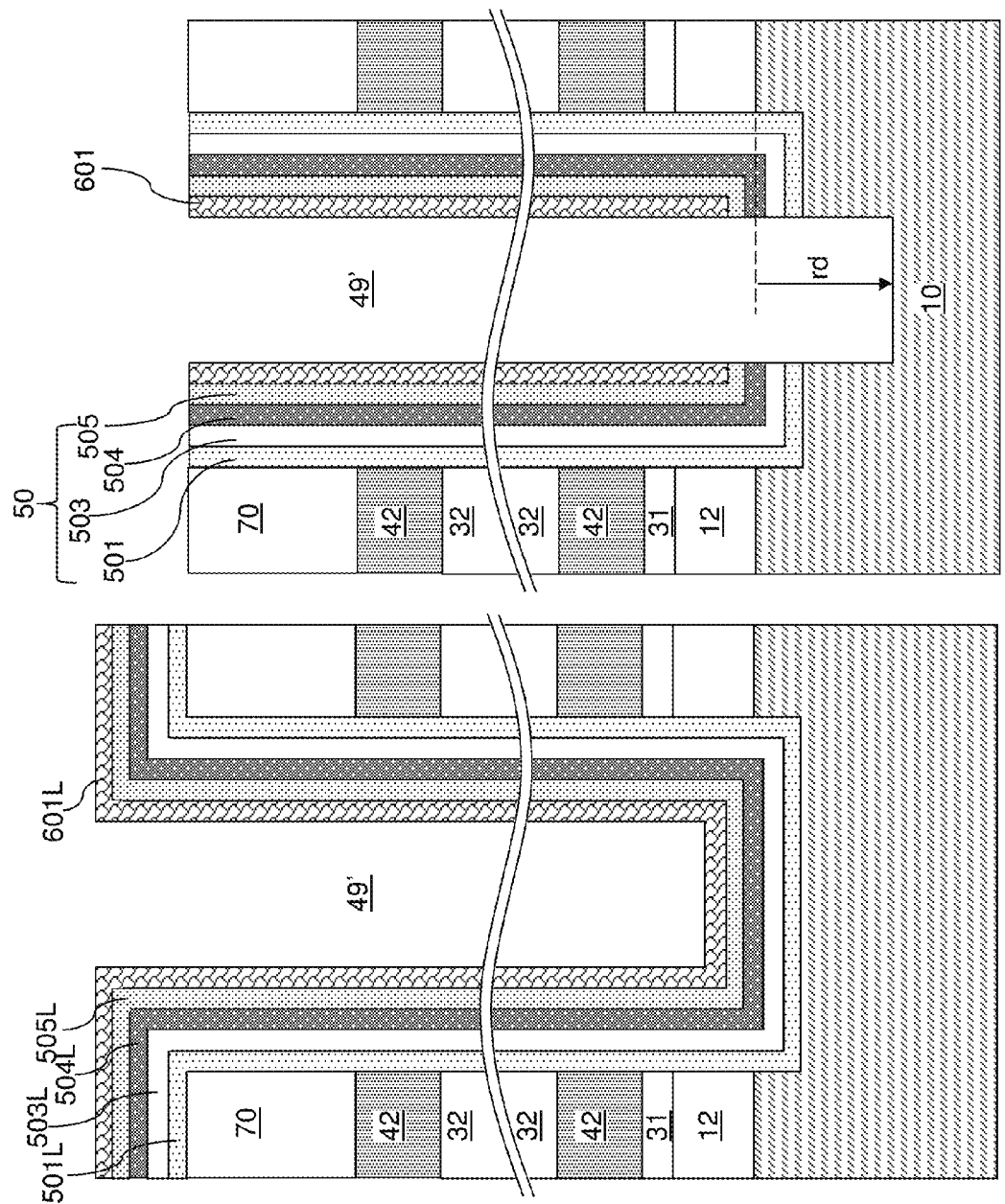

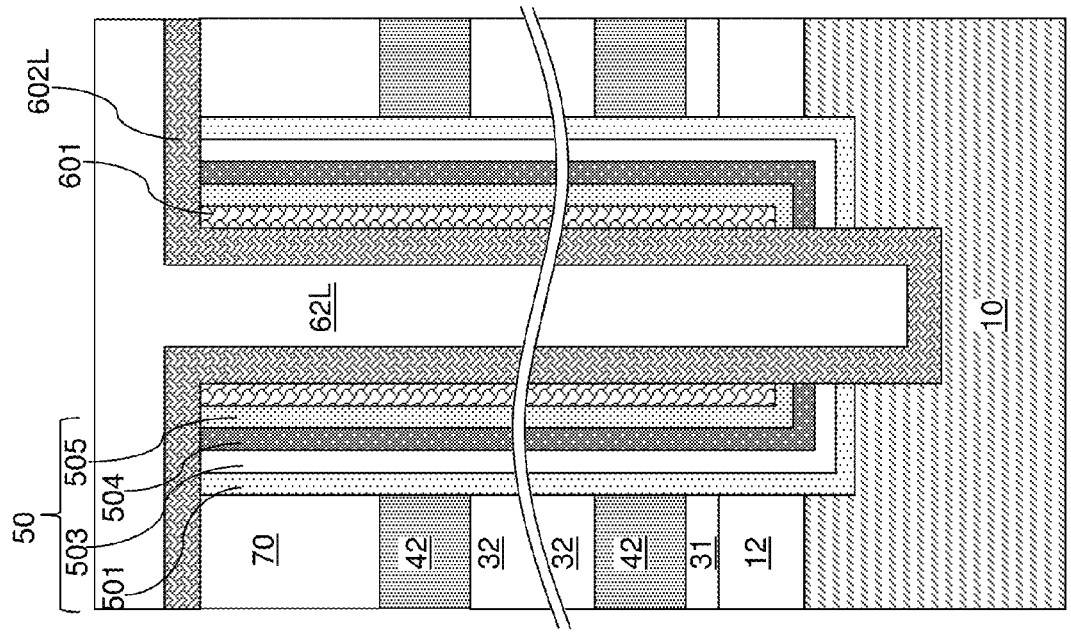
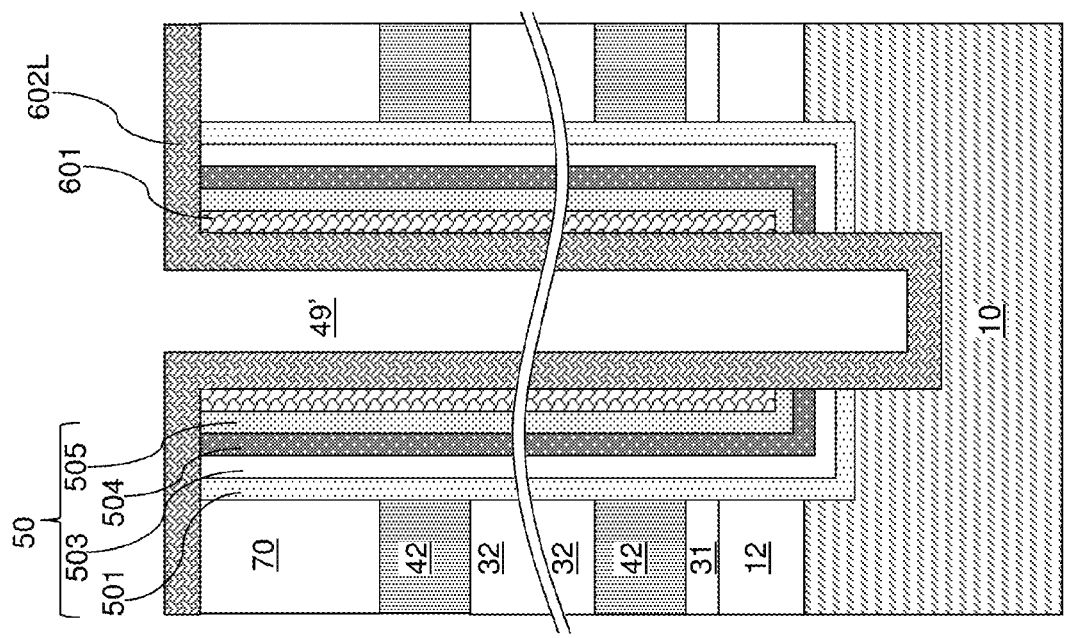

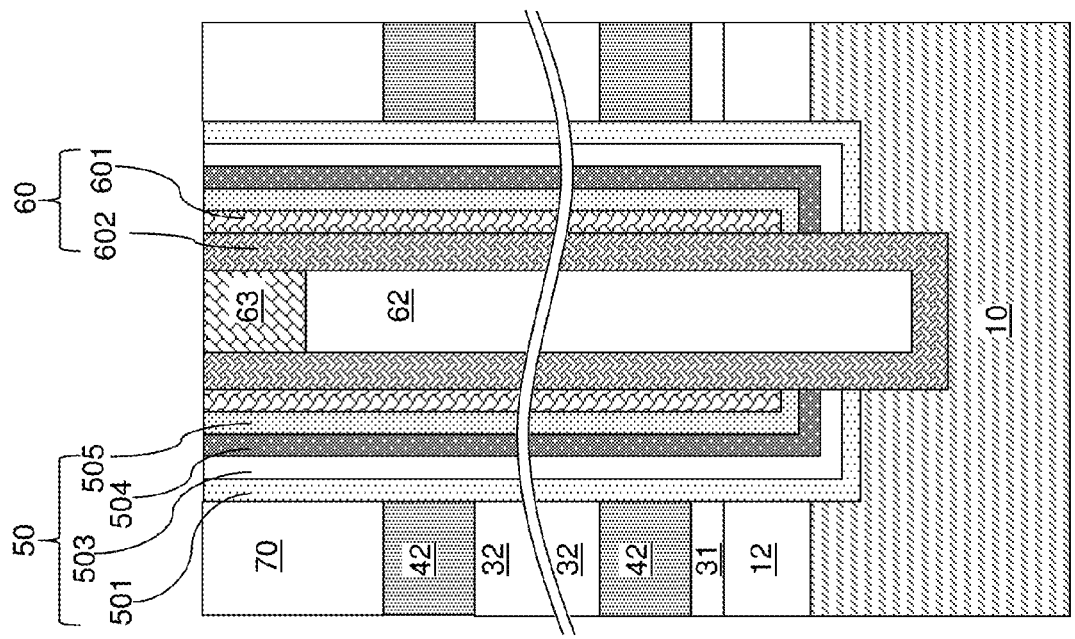
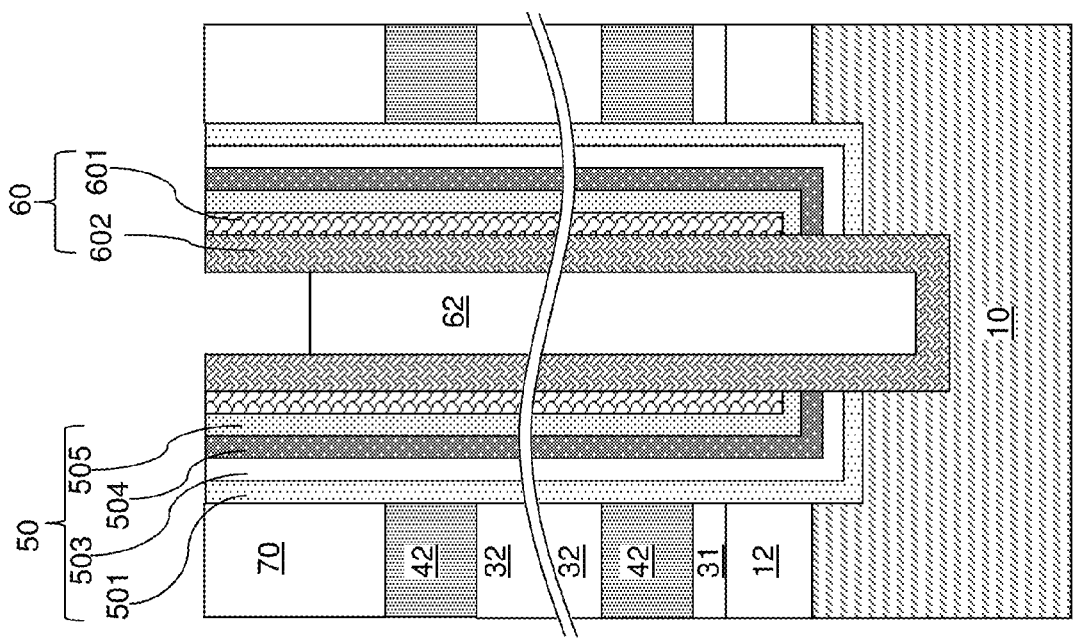

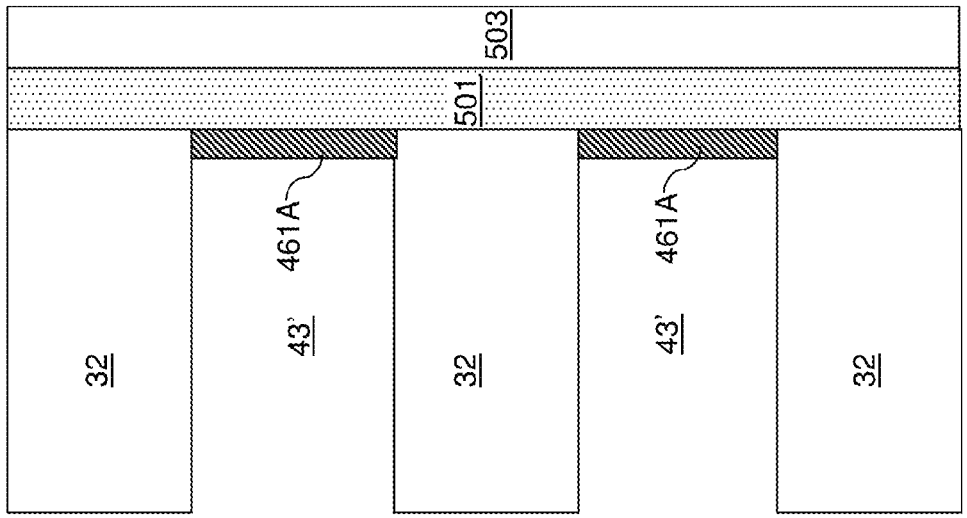
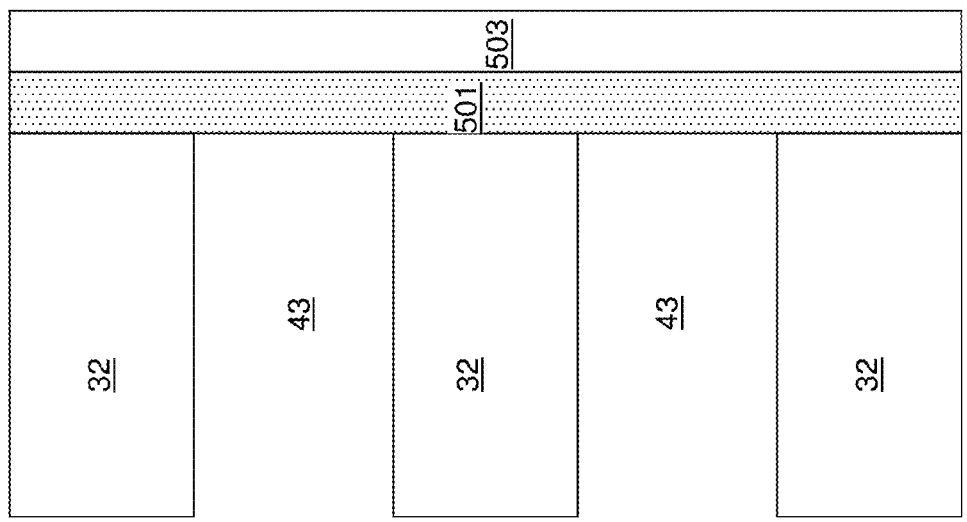

RUTHENIUM NUCLEATION LAYER FOR CONTROL GATE ELECTRODES IN A MEMORY STRUCTURE

FIELD

The present disclosure relates generally to the field of semiconductor devices and specifically to three-dimensional memory structures, such as vertical NAND strings and other three-dimensional devices, and methods of making thereof.

BACKGROUND

Three-dimensional vertical NAND strings having one bit per cell are disclosed in an article by T. Endoh, et. al., titled "Novel Ultra High Density Memory With A Stacked-Surrounding Gate Transistor (S-SGT) Structured Cell", IEDM Proc. (2001) 33-36.

SUMMARY

According to an aspect of the present disclosure, a three-dimensional memory device is provided, which comprises a stack of alternating layers comprising insulator layers and electrically conductive layers and located over a substrate, a memory opening extending through the stack, and a memory film and a semiconductor channel located within the memory opening. Each of the electrically conductive layers comprises a ruthenium portion and a conductive material portion comprising a material other than ruthenium. The ruthenium portion is more proximal to the memory film than the conductive material portion.

According to another aspect of the present disclosure, a method of manufacturing a three-dimensional memory device is provided. A stack of alternating layers comprising insulator layers and sacrificial material layers is formed over a substrate. A memory opening is formed through the stack. A memory film and a semiconductor channel are formed in the memory opening. Backside recesses are formed around the memory film by removing the sacrificial material layers. Electrically conductive layers are formed within the backside recesses. Each of the electrically conductive layers is formed by forming a ruthenium portion comprising ruthenium within a respective backside recess, and forming a conductive material portion comprising a material other than ruthenium on surfaces of the ruthenium portion.

BRIEF DESCRIPTION OF THE DRAWINGS

FIGS. 2A-2F are sequential vertical cross-sectional views of a memory opening within the exemplary structure during various processing steps employed to form a memory stack structure according to an embodiment of the present disclosure.

FIGS. 6A-6E are sequential vertical cross-sectional views of a magnified region M in FIGS. 5A and 5B during formation of first exemplary electrically conductive layers according to a first embodiment of the present disclosure.

DETAILED DESCRIPTION

As discussed above, the present disclosure is directed to three-dimensional memory structures, such as vertical NAND strings and other three-dimensional devices, and methods of making thereof, the various aspects of which are described below. The embodiments of the disclosure can be employed to form various structures including a multilevel memory structure, non-limiting examples of which include semiconductor devices such as three-dimensional monolithic memory array devices comprising a plurality of NAND memory strings. The drawings are not drawn to scale. Multiple instances of an element may be duplicated where a single instance of the element is illustrated, unless absence of duplication of elements is expressly described or clearly indicated otherwise. Ordinals such as "first," "second," and "third" are employed merely to identify similar elements, and different ordinals may be employed across the specification and the claims of the instant disclosure. As used herein, a first element located "on" a second element can be located on the exterior side of a surface of the second element or on the interior side of the second element. As used herein, a first element is located "directly on" a second element if there exist a physical contact between a surface of the first element and a surface of the second element.

A monolithic three-dimensional memory array is one in which multiple memory levels are formed above a single substrate, such as a semiconductor wafer, with no intervening substrates. The term "monolithic" means that layers of each level of the array are directly deposited on the layers of each underlying level of the array. In contrast, two dimensional arrays may be formed separately and then packaged together to form a non-monolithic memory device. For example, non-monolithic stacked memories have been constructed by forming memory levels on separate substrates and vertically stacking the memory levels, as described in U.S. Pat. No. 5,915,167 titled "Three-dimensional Structure Memory." The substrates may be thinned or removed from the memory levels before bonding, but as the memory levels are initially formed over separate substrates, such memories are not true monolithic three-dimensional memory arrays. The various three-dimensional memory devices of the present disclosure include a monolithic three-dimensional NAND string memory device, and can be fabricated employing the various embodiments described herein.

Figure 1:
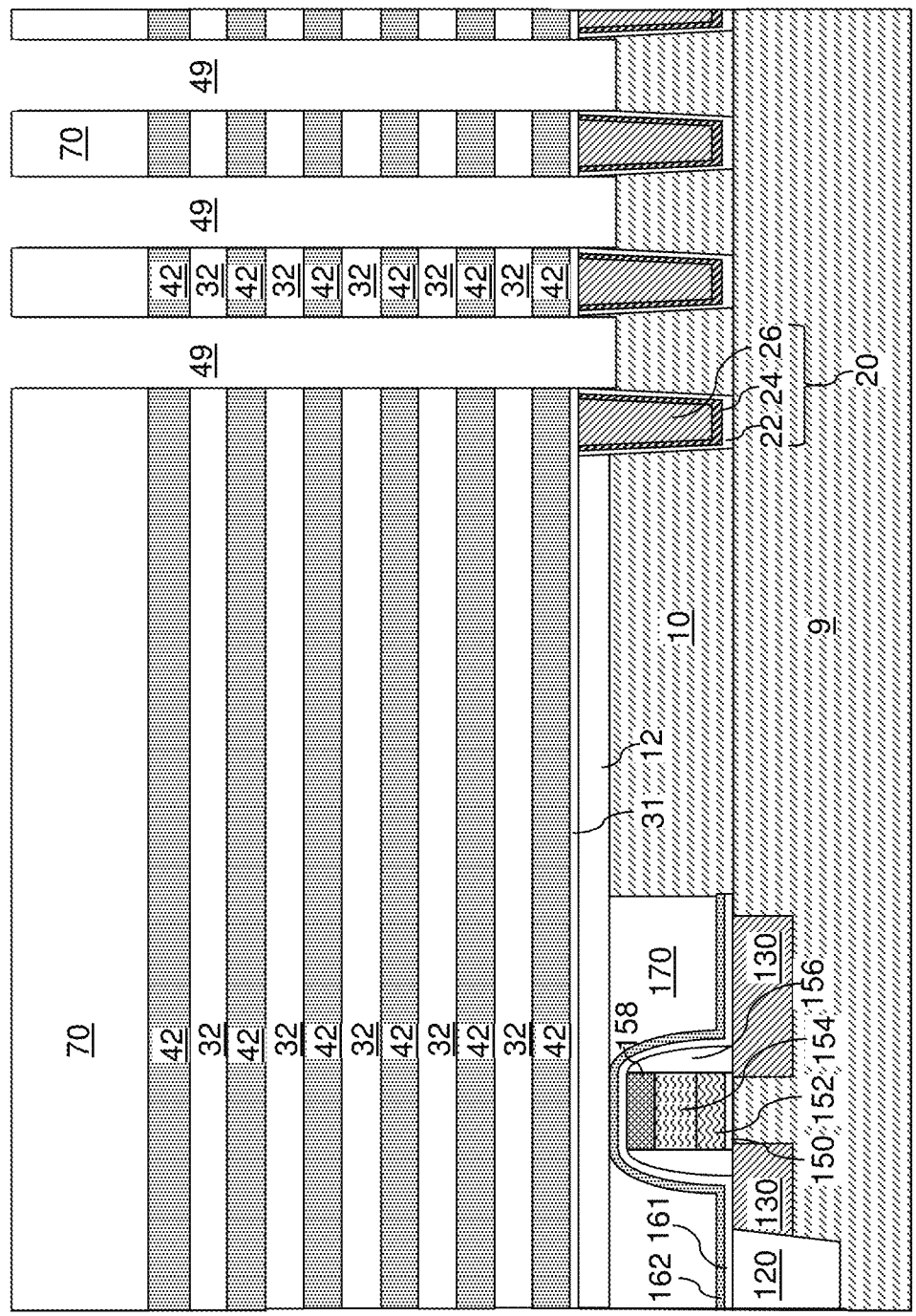
FIG. 1 is a vertical cross-sectional view of an exemplary structure after formation of a stack including an alternating plurality of material layers and memory openings extending through the stack according to an embodiment of the present disclosure.

Referring to FIG. 1, an exemplary structure according to an embodiment of the present disclosure is illustrated, which can be employed, for example, to fabricate a device structure containing vertical NAND memory devices. The exemplary structure includes a substrate, which can be a semiconductor substrate. The substrate can include a substrate semiconductor layer 9. The substrate semiconductor layer 9 is a semiconductor material layer, and can include at least one elemental semiconductor material, at least one III-V compound semiconductor material, at least one II-VI compound semiconductor material, at least one organic semiconductor material, or other semiconductor materials known in the art. The substrate can have a major surface 7, which can be, for example, a topmost surface of the substrate semiconductor layer 9. The major surface 7 can be a semiconductor surface. In one embodiment, the major surface 7 can be a single crystalline semiconductor surface.

As used herein, a "semiconductor material" refers to a material having electrical conductivity in the range from $1.0 \times 10^{-6}$ S/cm to $1.0 \times 10^5$ S/cm, and is capable of producing a doped material having electrical resistivity in a range from 1.0 S/cm to $1.0 \times 10^5$ S/cm upon suitable doping with an electrical dopant. As used herein, an "electrical dopant" refers to a p-type dopant that adds a hole to a balance band within a band structure, or an n-type dopant that adds an electron to a conduction band within a band structure. As used herein, a "conductive material" refers to a material having electrical conductivity greater than $1.0 \times 10^5$ S/cm. As used herein, an "insulator material" or a "dielectric material" refers to a material having electrical conductivity less than $1.0 \times 10^{-6}$ S/cm. All measurements for electrical conductivities are made at the standard condition. Optionally, at least one doped well (not expressly shown) can be formed within the substrate semiconductor layer 9.

At least one semiconductor device for a peripheral circuitry can be formed on a portion of the substrate semiconductor layer 9. The at least one semiconductor device can include, for example, field effect transistors. For example, at least one shallow trench isolation structure 120 can be formed by etching portions of the substrate semiconductor layer 9 and depositing a dielectric material therein. A gate dielectric layer, at least one gate conductor layer, and a gate cap dielectric layer can be formed over the substrate semiconductor layer 9, and can be subsequently patterned to form at least one gate structure (150, 152, 154, 158), each of which can include a gate dielectric 150, at least one gate electrode (152, 154), and a gate cap dielectric. A gate electrode (152, 154) may include a stack of a first gate electrode portion 152 and a second gate electrode portion 154. At least one gate spacer 156 can be formed around the at least one gate structure (150, 152, 154, 158) by depositing and anisotropically etching a conformal dielectric layer. Active regions 130 can be formed in upper portions of the substrate semiconductor layer 9, for example, by introducing electrical dopants employing the at least one gate structure (150, 152, 154, 158) as masking structures. Additional masks may be employed as needed. The active region 130 can include source regions and drain regions of field effect transistors. A first dielectric liner 161 and a second dielectric liner 162 can be optionally formed. Each of the first and second dielectric liners (161, 162) can comprise a silicon oxide layer, a silicon nitride layer, and/or a dielectric metal oxide layer. In an illustrative example, the first dielectric liner 161 can be a silicon oxide layer, and the second dielectric liner 162 can be a silicon nitride layer. The least one semiconductor device for the peripheral circuitry can contain a driver circuit for memory devices to be subsequently formed, which can include at least one NAND device.

A dielectric material such as silicon oxide can be deposited over the at least one semiconductor device, and can be subsequently planarized to form a planarization dielectric layer 170. In one embodiment the planarized top surface of the planarization dielectric layer 170 can be coplanar with a top surface of the dielectric liners (161, 162). Subsequently, the planarization dielectric layer 170 and the dielectric liners (161, 162) can be removed from an area to physically expose a top surface of the substrate semiconductor layer 9.

An optional semiconductor material layer 10 can be formed on the top surface of the substrate semiconductor layer 9 by deposition of a single crystalline semiconductor material, for example, by selective epitaxy. The deposited semiconductor material can be the same as, or can be different from, the semiconductor material of the substrate semiconductor layer 9. The deposited semiconductor material can be any material that can be employed for the semiconductor substrate layer 9 as described above. The single crystalline semiconductor material of the semiconductor material layer 10 can be in epitaxial alignment with the single crystalline structure of the substrate semiconductor layer 9. Portions of the deposited semiconductor material located above the top surface of the planarization dielectric layer 70 can be removed, for example, by chemical mechanical planarization (CMP). In this case, the semiconductor material layer 10 can have a top surface that is coplanar with the top surface of the planarization dielectric layer 170.

Optionally, a dielectric pad layer 12 can be formed above the semiconductor material layer 10 and the planarization dielectric layer 170. The dielectric pad layer 12 can be, for example, silicon oxide layer. The thickness of the dielectric pad layer 12 can be in a range from 3 nm to 30 nm, although lesser and greater thicknesses can also be employed.

At least one optional shallow trench can be formed through the dielectric pad layer 12 and an upper portion of the semiconductor material layer 10. The pattern of the at least one shallow trench can be selected such that lower select gate electrodes can be subsequently formed therein. For example, a lower select gate device level may be fabricated as described in U.S. patent application Ser. No. 14/133,979, filed on Dec. 19, 2013, U.S. patent application Ser. No. 14/225,116, filed on Mar. 25, 2014, and/or U.S. patent application Ser. No. 14/225,176, filed on Mar. 25, 2014, all of which are incorporated herein by reference.

A lower select gate structure 20 can be formed in each of the at least one shallow trench, for example, by forming a gate dielectric layer and at least one conductive material layer, and removing portions of the gate dielectric layer and the at least one conductive material layer from above the top surface of the dielectric pad layer 12, for example, by chemical mechanical planarization. Each lower select gate structure 20 can include a gate dielectric 22 and a gate electrode (24, 26). In one embodiment, each gate electrode (24, 26) can include an electrically conductive liner 24 and a conductive material portion 26. The electrically conductive liner 24 can include, for example, TiN, TaN, WN, or a combination thereof. The conductive material portion 26 can include, for example, W, Al, Cu, or combinations thereof. At least one optional shallow trench isolation structure (not shown) and/or at least one deep trench isolation structure (not shown) may be employed to provide electrical isolation among various semiconductor devices that are present, or are to be subsequently formed, on the substrate.

A dielectric cap layer 31 can be optionally formed. The dielectric cap layer 31 includes a dielectric material, and can be formed directly on top surfaces of the gate electrodes (24, 26). Exemplary materials that can be employed for the dielectric cap layer 31 include, but are not limited to, silicon oxide, a dielectric metal oxide, and silicon nitride (in case the material of second material layers to be subsequently formed is not silicon nitride). The dielectric cap layer 31 provides electrical isolation for the gate electrodes (24, 26).

A stack of an alternating plurality of first material layers (which can be insulating layers 32) and second material layers (which can be sacrificial material layer 42) is formed over the top surface of the substrate, which can be, for example, on the top surface of the dielectric cap layer 31. As used herein, an alternating plurality of first elements and second elements refers to a structure in which instances of the first elements and instances of the second elements alternate. Each instance of the first elements that is not an end element of the alternating plurality is adjoined by two instances of the second elements on both sides, and each instance of the second elements that is not an end element of the alternating plurality is adjoined by two instances of the first elements on both ends. The first elements may have the same thickness thereamongst, or may have different thicknesses. The second elements may have the same thickness thereamongst, or may have different thicknesses. The alternating plurality of first material layers and second material layers may begin with an instance of the first material layers or with an instance of the second material layers, and may end with an instance of the first material layers or with an instance of the second material layers. In one embodiment, an instance of the first elements and an instance of the second elements may form a unit that is repeated with periodicity within the alternating plurality.

Each first material layer includes a first material, and each second material layer includes a second material that is different from the first material. In one embodiment, each first material layer can be an insulator layer 32, and each second material layer can be a sacrificial material layer. In this case, the stack can include an alternating plurality of insulator layers 32 and sacrificial material layers 42.

The stack of the alternating plurality is herein referred to as an alternating stack (32, 42). In one embodiment, the alternating stack (32, 42) can include insulator layers 32 composed of the first material, and sacrificial material layers 42 composed of a second material different from that of insulator layers 32. The first material of the insulator layers 32 can be at least one electrically insulating material. As such, each insulator layer 32 can be an electrically insulating material layer. Electrically insulating materials that can be employed for the insulator layers 32 include, but are not limited to, silicon oxide (including doped or undoped silicate glass), silicon nitride, silicon oxynitride, organosilicate glass (OSG), spin-on dielectric materials, dielectric metal oxides that are commonly known as high dielectric constant (high-k) dielectric oxides (e.g., aluminum oxide, hafnium oxide, etc.) and silicates thereof, dielectric metal oxynitrides and silicates thereof, and organic insulating materials. In one embodiment, the first material of the insulator layers 32 can be silicon oxide.

The second material of the sacrificial material layers 42 is a sacrificial material that can be removed selective to the first material of the insulator layers 32. As used herein, a removal of a first material is "selective to" a second material if the removal process removes the first material at a rate that is at least twice the rate of removal of the second material. The ratio of the rate of removal of the first material to the rate of removal of the second material is herein referred to as a "selectivity" of the removal process for the first material with respect to the second material.

The sacrificial material layers 42 may comprise an electrically insulating material, a semiconductor material, or a conductive material. The second material of the sacrificial material layers 42 can be subsequently replaced with electrically conductive electrodes which can function, for example, as control gate electrodes of a vertical NAND device. Non-limiting examples of the second material include silicon nitride, an amorphous semiconductor material (such as amorphous silicon), and a polycrystalline semiconductor material (such as polysilicon). In one embodiment, the sacrificial material layers 42 can be material layers that comprise silicon nitride or a semiconductor material including at least one of silicon and germanium.

In one embodiment, the insulator layers 32 can include silicon oxide, and sacrificial material layers can include silicon nitride sacrificial material layers. The first material of the insulator layers 32 can be deposited, for example, by chemical vapor deposition (CVD). For example, if silicon oxide is employed for the insulator layers 32, tetraethyl orthosilicate (TEOS) can be employed as the precursor material for the CVD process. The second material of the sacrificial material layers 42 can be formed, for example, CVD or atomic layer deposition (ALD).

The sacrificial material layers 42 can be suitably patterned so that conductive material portions to be subsequently formed by replacement of the sacrificial material layers 42 can function as electrically conductive electrodes, such as the control gate electrodes of the monolithic three-dimensional NAND string memory devices to be subsequently formed. The sacrificial material layers 42 may comprise a portion having a strip shape extending substantially parallel to the major surface 7 of the substrate.

The thicknesses of the insulator layers 32 and the sacrificial material layers 42 can be in a range from 20 nm to 50 nm, although lesser and greater thicknesses can be employed for each insulator layer 32 and for each sacrificial material layer 42. The number of repetitions of the pairs of an insulator layer 32 and a sacrificial material layer (e.g., a control gate electrode or a sacrificial material layer) 42 can be in a range from 2 to 1,024, and typically from 8 to 256, although a greater number of repetitions can also be employed. The top and bottom gate electrodes in the stack may function as the select gate electrodes. In one embodiment, each sacrificial material layer 42 in the alternating stack (32, 42) can have a uniform thickness that is substantially invariant within each respective sacrificial material layer 42.

Optionally, an insulating cap layer 70 can be formed over the alternating stack (32, 42). The insulating cap layer 70 includes a dielectric material that is different from the material of the sacrificial material layers 42. In one embodiment, the insulating cap layer 70 can include a dielectric material that can be employed for the insulator layers 32 as described above. The insulating cap layer 70 can have a greater thickness than each of the insulator layers 32. The insulating cap layer 70 can be deposited, for example, by chemical vapor deposition. In one embodiment, the insulating cap layer 70 can be a silicon oxide layer.

Subsequently, a lithographic material stack (not shown) including at least a photoresist layer can be formed over the insulating cap layer 70 and the alternating stack (32, 42), and can be lithographically patterned to form openings therein. The pattern in the lithographic material stack can be transferred through the insulating cap layer 70 and through entirety of the alternating stack (32, 42) by at least one anisotropic etch that employs the patterned lithographic material stack as an etch mask. Portions of the alternating stack (32, 42) underlying the openings in the patterned lithographic material stack are etched to form memory openings 49. In other words, the transfer of the pattern in the patterned lithographic material stack through the alternating stack (32, 42) forms the memory openings 49 that extend through the alternating stack (32, 42). The chemistry of the anisotropic etch process employed to etch through the materials of the alternating stack (32, 42) can alternate to optimize etching of the first and second materials in the alternating stack (32, 42). The anisotropic etch can be, for example, a series of reactive ion etches. Optionally, the dielectric cap layer 31 may be used as an etch stop layer between the alternating stack (32, 42) and the substrate. The sidewalls of the memory openings 49 can be substantially vertical, or can be tapered. The patterned lithographic material stack can be subsequently removed, for example, by ashing.

The memory openings 49 are formed through the dielectric cap layer 31 and the dielectric pad layer 12 so that the memory openings 49 extend from the top surface of the alternating stack (32, 42) to the top surface of the semiconductor material layer 10 within the substrate between the lower select gate electrodes (24, 26). In one embodiment, an overetch into the semiconductor material layer 10 may be optionally performed after the top surface of the semiconductor material layer 10 is physically exposed at a bottom of each memory opening 49. The overetch may be performed prior to, or after, removal of the lithographic material stack. In other words, the recessed surfaces of the semiconductor material layer 10 may be vertically offset from the undressed top surfaces of the semiconductor material layer 10 by a recess depth. The recess depth can be, for example, in a range from 1 nm to 50 nm, although lesser and greater recess depths can also be employed. The overetch is optional, and may be omitted. If the overetch is not performed, the bottom surface of each memory opening 49 can be coplanar with the topmost surface of the semiconductor material layer 10. Each of the memory openings 49 can include a sidewall (or a plurality of sidewalls) that extends substantially perpendicular to the topmost surface of the substrate. The region in which the array of memory openings 49 is formed is herein referred to as a device region. The substrate semiconductor layer 9 and the semiconductor material layer 10 collectively constitutes a substrate (9, 10), which can be a semiconductor substrate. Alternatively, the semiconductor material layer 10 may be omitted, and the memory openings 49 can be extend to a top surface of the semiconductor material layer 10.

A memory stack structure can be formed in each of the memory opening employing various embodiments of the present disclosure. FIGS. 2A-2F illustrate sequential vertical cross-sectional views of a memory opening within the exemplary structure during formation of an exemplary memory stack structure according to a first embodiment of the present disclosure. Formation of the exemplary memory stack structure can be performed within each of the memory openings 49 in the exemplary structure illustrated in FIG. 1.

Referring to FIG. 2A, a memory opening 49 is illustrated. The memory opening 49 extends through the insulating cap layer 70, the alternating stack (32, 42), the dielectric cap layer 31, the dielectric pad layer 12, and optionally into an upper portion of the semiconductor material layer 10. The recess depth of the bottom surface of each memory opening with respect to the top surface of the semiconductor material layer 10 can be in a range from 0 nm to 30 nm, although greater recess depths can also be employed. Optionally, the sacrificial material layers 42 can be laterally recessed partially to form lateral recesses (not shown), for example, by an isotropic etch.

A series of layers including at least one blocking dielectric layer (501L, 503L), a memory material layer 504L, a tunneling dielectric layer 505L, and an optional first semiconductor channel layer 601L can be sequentially deposited in the memory openings 49. The at least one blocking dielectric layer (501L, 503L) can include, for example, a first blocking dielectric layer 501L and a second blocking dielectric layer 503L.

The first blocking dielectric layer 501L can be deposited on the sidewalls of each memory opening 49 by a conformal deposition method. The first blocking dielectric layer 501L includes a dielectric material, which can be a dielectric metal oxide. As used herein, a dielectric metal oxide refers to a dielectric material that includes at least one metallic element and at least oxygen. The dielectric metal oxide may consist essentially of the at least one metallic element and oxygen, or may consist essentially of the at least one metallic element, oxygen, and at least one non-metallic element such as nitrogen. In one embodiment, the first blocking dielectric layer 501L can include a dielectric metal oxide having a dielectric constant greater than 7.9, i.e., having a dielectric constant greater than the dielectric constant of silicon nitride.

Non-limiting examples of dielectric metal oxides include aluminum oxide ($Al_2O_3$), hafnium oxide ($HfO_2$), lanthanum oxide ($LaO_2$), yttrium oxide ($Y_2O_3$), tantalum oxide ($Ta_2O_5$), silicates thereof, nitrogen-doped compounds thereof, alloys thereof, and stacks thereof. The first blocking dielectric layer 501L can be deposited, for example, by chemical vapor deposition (CVD), atomic layer deposition (ALD), pulsed laser deposition (PLD), liquid source misted chemical deposition, or a combination thereof. The thickness of the first blocking dielectric layer SOIL can be in a range from 1 nm to 20 nm, although lesser and greater thicknesses can also be employed. The first blocking dielectric layer SOIL can subsequently function as a dielectric material portion that blocks leakage of stored electrical charges to control gate electrodes. In one embodiment, the first blocking dielectric layer SOIL includes aluminum oxide.

The second blocking dielectric layer 503L can be formed on the first blocking dielectric layer 501L. The second blocking dielectric layer 503L can include a dielectric material that is different from the dielectric material of the first blocking dielectric layer 501L. In one embodiment, the second blocking dielectric layer 503L can include silicon oxide, a dielectric metal oxide having a different composition than the first blocking dielectric layer 501L, silicon oxynitride, silicon nitride, or a combination thereof. In one embodiment, the second blocking dielectric layer 503L can include silicon oxide. The second blocking dielectric layer 503L can be formed by a conformal deposition method such as low pressure chemical vapor deposition, atomic layer deposition, or a combination thereof. The thickness of the second blocking dielectric layer 503L can be in a range from 1 nm to 20 nm, although lesser and greater thicknesses can also be employed. Alternatively, the first blocking dielectric layer 501L and/or the second blocking dielectric layer 503L can be omitted, and a blocking dielectric layer can be formed after formation of backside recesses on surfaces of memory films to be subsequently formed.

The memory material layer 504L, the tunneling dielectric layer 505L, and the optional first semiconductor channel layer 601L can be sequentially formed. In one embodiment, the memory material layer 504L can be a charge trapping material including a dielectric charge trapping material, which can be, for example, silicon nitride. Alternatively, the memory material layer 504L can include a conductive material such as doped polysilicon or a metallic material that is patterned into multiple electrically isolated portions (e.g., floating gates), for example, by being formed within lateral recesses into sacrificial material layers 42. In one embodiment, the memory material layer 504L includes a silicon nitride layer.

The memory material layer 504L can be formed as a single memory material layer of homogeneous composition, or can include a stack of multiple memory material layers. The multiple memory material layers, if employed, can comprise a plurality of spaced-apart floating gate material layers that contain conductive materials (e.g., metal such as tungsten, molybdenum, tantalum, titanium, platinum, ruthenium, and alloys thereof, or a metal silicide such as tungsten silicide, molybdenum silicide, tantalum silicide, titanium silicide, nickel silicide, cobalt silicide, or a combination thereof) and/or semiconductor materials (e.g., polycrystalline or amorphous semiconductor material including at least one elemental semiconductor element or at least one compound semiconductor material). Alternatively or additionally, the memory material layer 504L may comprise an insulating charge trapping material, such as one or more silicon nitride segments. Alternatively, the memory material layer 504L may comprise conductive nanoparticles such as metal nanoparticles, which can be, for example, ruthenium nanoparticles. The memory material layer 504L can be formed, for example, by chemical vapor deposition (CVD), atomic layer deposition (ALD), physical vapor deposition (PVD), or any suitable deposition technique for storing electrical charges therein. The thickness of the memory material layer 504L can be in a range from 2 nm to 20 nm, although lesser and greater thicknesses can also be employed.

The tunneling dielectric layer 505L includes a dielectric material through which charge tunneling can be performed under suitable electrical bias conditions. The charge tunneling may be performed through hot-carrier injection or by Fowler-Nordheim tunneling induced charge transfer depending on the mode of operation of the monolithic three-dimensional NAND string memory device to be formed. The tunneling dielectric layer 505L can include silicon oxide, silicon nitride, silicon oxynitride, dielectric metal oxides (such as aluminum oxide and hafnium oxide), dielectric metal oxynitride, dielectric metal silicates, alloys thereof, and/or combinations thereof. In one embodiment, the tunneling dielectric layer 505L can include a stack of a first silicon oxide layer, a silicon oxynitride layer, and a second silicon oxide layer, which is commonly known as an ONO stack. In one embodiment, the tunneling dielectric layer 505L can include a silicon oxide layer that is substantially free of carbon or a silicon oxynitride layer that is substantially free of carbon. The thickness of the tunneling dielectric layer 505L can be in a range from 2 nm to 20 nm, although lesser and greater thicknesses can also be employed.

The optional first semiconductor channel layer 601L includes a semiconductor material such as at least one elemental semiconductor material, at least one III-V compound semiconductor material, at least one II-VI compound semiconductor material, at least one organic semiconductor material, or other semiconductor materials known in the art. In one embodiment, the first semiconductor channel layer 601L includes amorphous silicon or polysilicon. The first semiconductor channel layer 601L can be formed by a conformal deposition method such as low pressure chemical vapor deposition (LPCVD). The thickness of the first semiconductor channel layer 601L can be in a range from 2 nm to 10 nm, although lesser and greater thicknesses can also be employed. A cavity 49' is formed in the volume of each memory opening 49 that is not filled with the deposited material layers (501L, 503L, 504L, 5051, 601L).

Referring to FIG. 2B, the optional first semiconductor channel layer 601L, the tunneling dielectric layer 505L, the memory material layer 504L, the at least one blocking dielectric layer (501L, 503L) are sequentially anisotropically etched employing at least one anisotropic etch process. The portions of the first semiconductor channel layer 601L, the tunneling dielectric layer 505L, the memory material layer 504L, and the at least one blocking dielectric layer (501L, 503L) located above the top surface of the insulating cap layer 70 can be removed by the at least one anisotropic etch process. Further, the horizontal portions of the first semiconductor channel layer 601L, the tunneling dielectric layer 505L, the memory material layer 504L, and the at least one blocking dielectric layer (501L, 503L) at a bottom of each cavity 49' can be removed to form openings in remaining portions thereof. Each of the first semiconductor channel layer 601L, the tunneling dielectric layer 505L, the memory material layer 504L, and the at least one blocking dielectric layer (SOIL, 503L) can be etched by anisotropic etch process.

Each remaining portion of the first semiconductor channel layer 601L constitutes a first semiconductor channel portion 601. Each remaining portion of the tunneling dielectric layer 505L constitutes a tunneling dielectric 505. Each remaining portion of the memory material layer 504L is herein referred to as a charge storage element 504. In one embodiment, the charge storage element 504 can be a contiguous layer, i.e., can be a charge storage layer. Each remaining portion of the second blocking dielectric layer 503L is herein referred to as a second blocking dielectric 503. Each remaining portion of the first blocking dielectric layer 501L is herein referred to as a first blocking dielectric 501. A surface of the semiconductor material layer 10 can be physically exposed underneath the opening through the first semiconductor channel portion 601, the tunneling dielectric 505, the charge storage element 504, and the at least one blocking dielectric (501, 503). Optionally, the physically exposed semiconductor surface at the bottom of each cavity 49' can be vertically recessed so that the recessed semiconductor surface underneath the cavity 49' is vertically offset from the topmost surface of the semiconductor material layer 10 by a recess distance rd. A tunneling dielectric 505 is embedded within a charge storage element 504. The charge storage element 504 can comprise a charge trapping material or a floating gate material.

In one embodiment, the first semiconductor channel portion 601, the tunneling dielectric 505, the charge storage element 504, the second blocking dielectric 503, and the first blocking dielectric 501 can have vertically coincident sidewalls. As used herein, a first surface is "vertically coincident" with a second surface if there exists a vertical plane including both the first surface and the second surface. Such a vertical plane may, or may not, have a horizontal curvature, but does not include any curvature along the vertical direction, i.e., extends straight up and down.

Referring to FIG. 2C, a second semiconductor channel layer 602L can be deposited directly on the semiconductor surface of the semiconductor material layer 10 in the substrate (9, 10), and directly on the first semiconductor channel portion 601. The second semiconductor channel layer 602L includes a semiconductor material such as at least one elemental semiconductor material, at least one III-V compound semiconductor material, at least one II-VI compound semiconductor material, at least one organic semiconductor material, or other semiconductor materials known in the art. In one embodiment, the second semiconductor channel layer 602L includes amorphous silicon or polysilicon. The second semiconductor channel layer 602L can be formed by a conformal deposition method such as low pressure chemical vapor deposition (LPCVD). The thickness of the second semiconductor channel layer 602L can be in a range from 2 nm to 10 nm, although lesser and greater thicknesses can also be employed. The second semiconductor channel layer 602L may partially fill the cavity 49' in each memory opening, or may fully fill the cavity in each memory opening.

The materials of the first semiconductor channel portion 601 and the second semiconductor channel layer 602L are collectively referred to as a semiconductor channel material. In other words, the semiconductor channel material is a set of all semiconductor material in the first semiconductor channel portion 601 and the second semiconductor channel layer 602L.

Referring to FIG. 2D, in case the cavity 49' in each memory opening is not completely filled by the second semiconductor channel layer 602L, a dielectric core layer 62L can be deposited in the cavity 49' to fill any remaining portion of the cavity 49' within each memory opening. The dielectric core layer 62L includes a dielectric material such as silicon oxide or organosilicate glass. The dielectric core layer 62L can be deposited by a conformal deposition method such as low pressure chemical vapor deposition (LPCVD), or by a self-planarizing deposition process such as spin coating.

Referring to FIG. 2E, the horizontal portion of the dielectric core layer 62L can be removed, for example, by a recess etch from above the top surface of the insulating cap layer 70. Further, the horizontal portion of the second semiconductor channel layer 602L located above the top surface of the insulating cap layer 70 can be removed by a planarization process, which can employ a recess etch or chemical mechanical planarization (CMP). Each remaining portion of the second semiconductor channel layer 602L within a memory opening constitutes a second semiconductor channel portion 602.

Each adjoining pair of a first semiconductor channel portion 601 and a second semiconductor channel portion 602 can collectively form a semiconductor channel 60 through which electrical current can flow when a vertical NAND device including the semiconductor channel 60 is turned on. A tunneling dielectric 505 is embedded within a charge storage element 504, and laterally surrounds a portion of the semiconductor channel 60. Each adjoining set of a first blocking dielectric 501, a second blocking dielectric 503, a charge storage element 504, and a tunneling dielectric 505 collectively constitute a memory film 50, which can store electrical charges with a macroscopic retention time. In some embodiments, a first blocking dielectric 501 and/or a second blocking dielectric 503 may not be present in the memory film 50 at this step, and a blocking dielectric may be subsequently formed after formation of backside recesses. As used herein, a macroscopic retention time refers to a retention time suitable for operation of a memory device as a permanent memory device such as a retention time in excess of 24 hours.

The top surface of the remaining portion of the dielectric core layer 62L can be further recessed within each memory opening, for example, by a recess etch to a depth that is located between the top surface of the insulating cap layer 70 and the bottom surface of the insulating cap layer 70. Each remaining portion of the dielectric core layer 62L constitutes a dielectric core 62.

Referring to FIG. 2F, drain regions 63 can be formed by depositing a doped semiconductor material within each recessed region above the dielectric cores 62. The doped semiconductor material can be, for example, doped polysilicon. Excess portions of the deposited semiconductor material can be removed from above the top surface of the insulating cap layer 70, for example, by chemical mechanical planarization (CMP) or a recess etch to form the drain regions 63.

Figure 3:
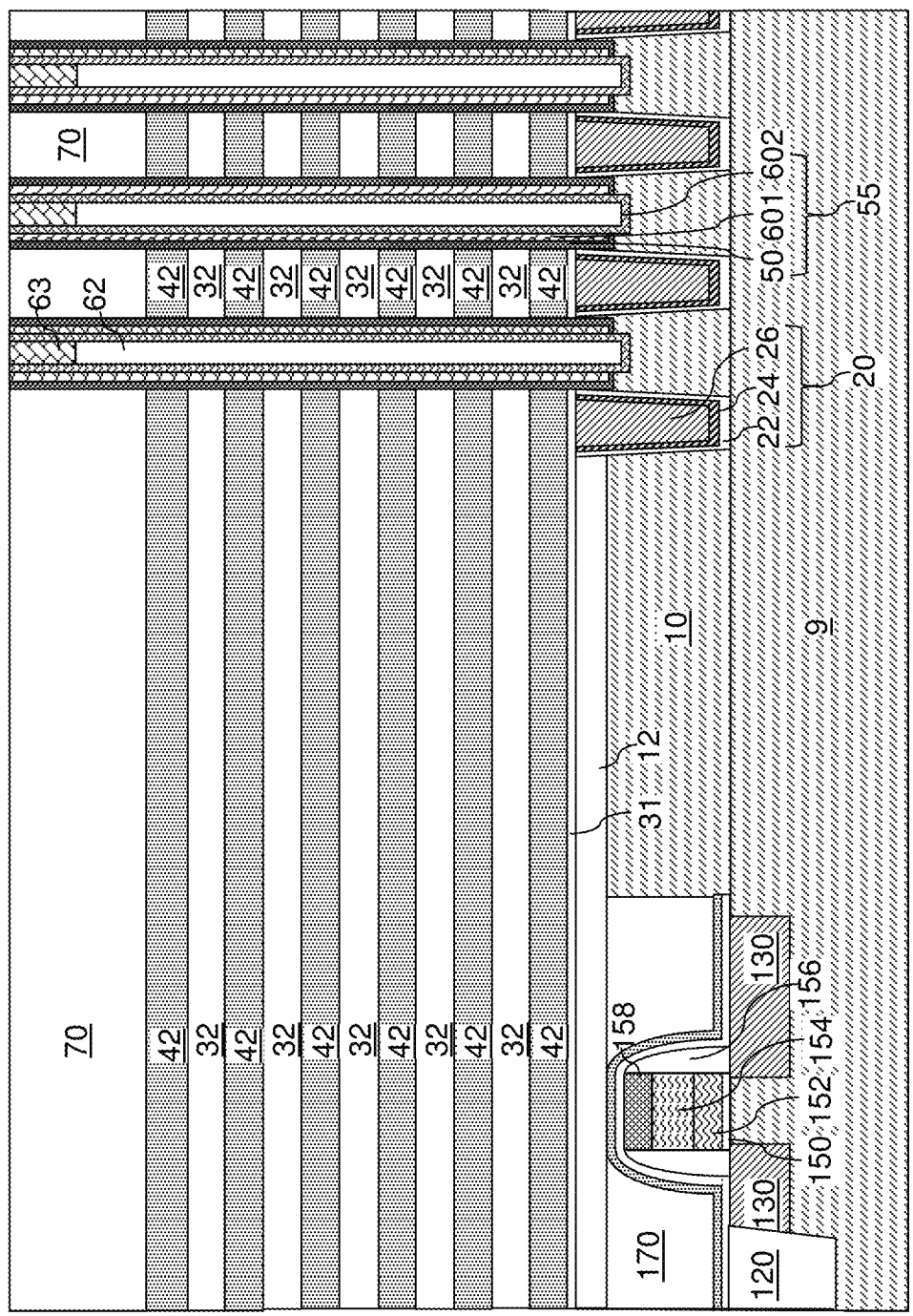
FIG. 3 is a vertical cross-sectional view of the exemplary structure after formation of memory stack structures according to an embodiment of the present disclosure.

The exemplary memory stack structure can be embedded into the exemplary structure illustrated in FIG. 1. FIG. 3 illustrates the exemplary structure that incorporates multiple instances of the exemplary memory stack structure of FIG. 2F. The exemplary structure includes a semiconductor device, which comprises a stack (32, 42) including an alternating plurality of material layers (e.g., the sacrificial material layers 42) and insulator layers 32 located over a semiconductor substrate (9, 10), and a memory opening extending through the stack (32, 42). The semiconductor device further comprises a first blocking dielectric 501 vertically extending from a bottommost layer (e.g., the bottommost sacrificial material layer 42) of the stack to a topmost layer (e.g., the topmost sacrificial material layer 42) of the stack, and contacting a sidewall of the memory opening and a horizontal surface of the semiconductor substrate. While the present disclosure is described employing the illustrated configuration for the memory stack structure, the methods of the present disclosure can be applied to alternative memory stack structures including a polycrystalline semiconductor channel.

Figure 4:
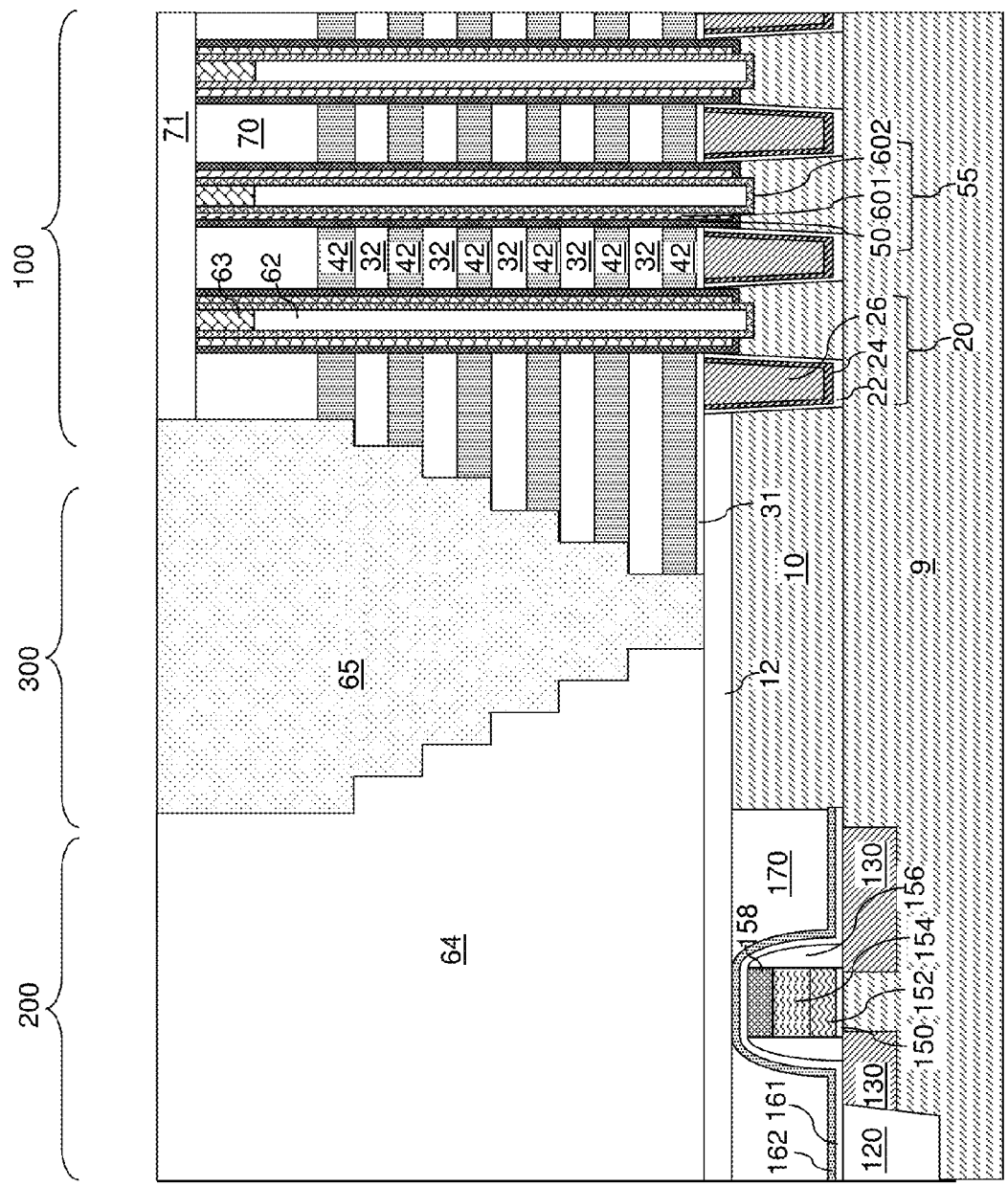
FIG. 4 is a vertical cross-sectional view of the exemplary structure after formation of a set of stepped surfaces and a retro-stepped dielectric material portion according to an embodiment of the present disclosure.

Referring to FIG. 4, at least one dielectric cap layer 71 can be optionally formed over the planarization dielectric layer 70. In one embodiment, the at least one dielectric cap layer 71 can include dielectric materials through which deuterium atoms can permeate. For example, the at least one dielectric cap layer can include silicon oxide and/or a dielectric metal oxide.

Optionally, a portion of the alternating stack (32, 42) can be removed, for example, by applying and patterning a photoresist layer with an opening and by transferring the pattern of the opening through the alternating stack (32, 42) employing an etch such as an anisotropic etch. An optional trench extending through the entire thickness of the alternating stack (32, 42) can be formed within an area that includes a peripheral device region 200 and a portion of a contact region 300, which is adjacent to a device region 100 that includes an array of memory stack structures 55. Subsequently, the trench can be filled with an optional dielectric material such as silicon oxide. Excess portions of the dielectric material can be removed from above the top surface of the at least one dielectric cap layer 71 by a planarization process such as chemical mechanical planarization and/or a recess etch. The top surfaces of the at least one dielectric cap layer 71 can be employed as a stopping surface during the planarization. The remaining dielectric material in the trench constitutes a dielectric material portion 64.

A stepped cavity can be formed within the contact region 300, which can straddle the dielectric material portion 64 and a portion of the alternating stack (32, 42). Alternatively, the dielectric material portion 64 may be omitted and the stepped cavity 69 may be formed directly in the stack (32, 42). The stepped cavity can have various stepped surfaces such that the horizontal cross-sectional shape of the stepped cavity changes in steps as a function of the vertical distance from the top surface of the substrate (9, 10). In one embodiment, the stepped cavity can be formed by repetitively performing a set of processing steps. The set of processing steps can include, for example, an etch process of a first type that vertically increases the depth of a cavity by one or more levels, and an etch process of a second type that laterally expands the area to be vertically etched in a subsequent etch process of the first type. As used herein, a "level" of a structure including alternating plurality is defined as the relative position of a pair of a first material layer and a second material layer within the structure.

The dielectric material portion 64 can have stepped surfaces after formation of the stepped cavity, and a peripheral portion of the alternating stack (32, 42) can have stepped surfaces after formation of the stepped cavity. As used herein, "stepped surfaces" refer to a set of surfaces that include at least two horizontal surfaces and at least two vertical surfaces such that each horizontal surface is adjoined to a first vertical surface that extends upward from a first edge of the horizontal surface, and is adjoined to a second vertical surface that extends downward from a second edge of the horizontal surface. A "stepped cavity" refers to a cavity having stepped surfaces.

A retro-stepped dielectric material portion 65 (i.e., an insulating fill material portion) can be formed in the stepped cavity by deposition of a dielectric material therein. A dielectric material such as silicon oxide can be deposited in the stepped cavity. Excess portions of the deposited dielectric material can be removed from above the top surface of the at least one dielectric cap layer 71, for example, by chemical mechanical planarization (CMP). The remaining portion of the deposited dielectric material filling the stepped cavity constitutes the retro-stepped dielectric material portion 65. As used herein, a "retro-stepped" element refers to an element that has stepped surfaces and a horizontal cross-sectional area that increases monotonically as a function of a vertical distance from a top surface of a substrate on which the element is present. If silicon oxide is employed for the retro-stepped dielectric material portion 65, the silicon oxide of the retro-stepped dielectric material portion 65 may, or may not, be doped with dopants such as B, P, and/or F.

Figure 5A:
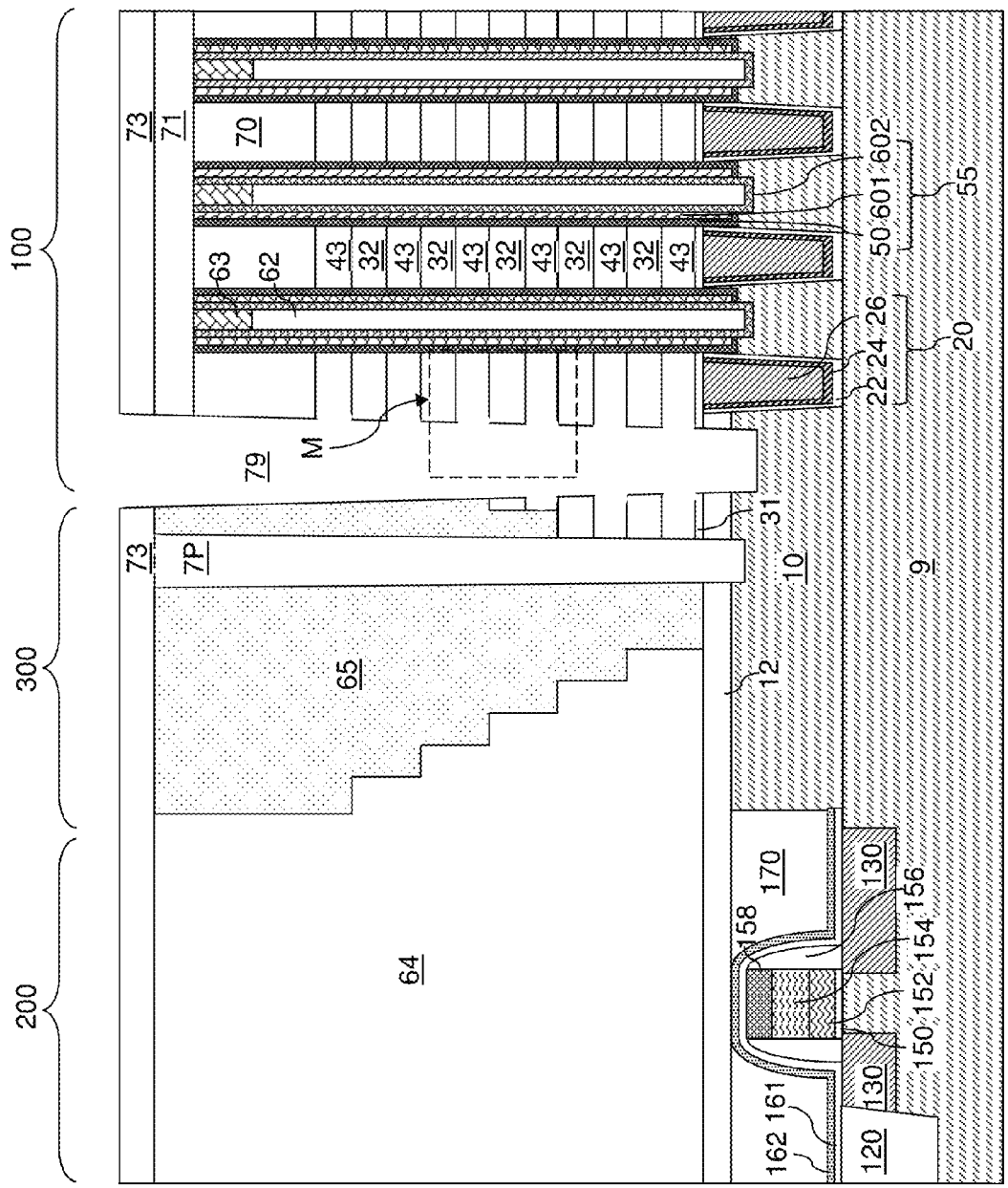
FIG. 5A is a vertical cross-sectional view of the exemplary structure after formation of a backside via cavity and backside recesses according to an embodiment of the present disclosure.
Figure 5B:
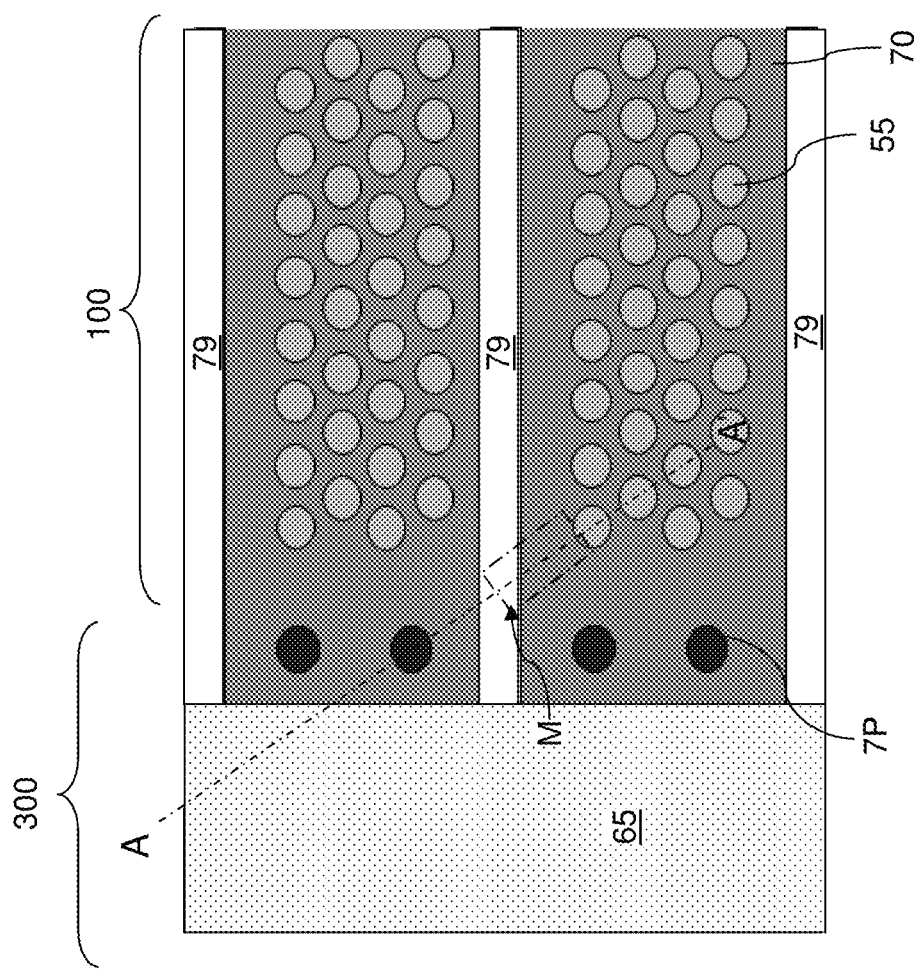
FIG. 5B is a see-through top-down view of the exemplary structure of FIG. 5A. The vertical plane A-A' is the plane of the vertical cross-sectional view of FIG. 5A.

Referring to FIGS. 5A and 5B, at least one dielectric support pillar 7P may be optionally formed through the retro-stepped dielectric material portion 65 and/or through the alternating stack (32, 42). The plane A-A' in FIG. 5B corresponds to the plane of the vertical cross-sectional view of FIG. 5A. In one embodiment, the at least one dielectric support pillar 7P can be formed in the contact region 300, which is located adjacent to the device region 100. The at least one dielectric support pillar 7P can be formed, for example, by forming an opening extending through the retro-stepped dielectric material portion 65 and/or through the alternating stack (32, 42) and at least to the top surface of the substrate (9, 10), and by filling the opening with a dielectric material that is resistant to the etch chemistry to be employed to remove the sacrificial material layers 42. In one embodiment, the at least one dielectric support pillar can include silicon oxide and/or a dielectric metal oxide such as aluminum oxide. In one embodiment, the portion of the dielectric material that is deposited over the at least one dielectric cap layer 71 concurrently with deposition of the at least one dielectric support pillar 7P can be present over the at least one dielectric cap layer 71 as a dielectric pillar material layer 73. The dielectric pillar material layer 73 and the at least one dielectric support pillar 7P can be formed as a single contiguous structure of integral construction, i.e., without any material interface therebetween. In another embodiment, the portion of the dielectric material that is deposited over the at least one dielectric cap layer 71 concurrently with deposition of the at least one dielectric support pillar 7P can be removed, for example, by chemical mechanical planarization or a recess etch. In this case, the dielectric pillar material layer 73 is not present, and the top surface of the at least one dielectric cap layer 71 can be physically exposed.

A photoresist layer (not shown) can be applied over the alternating stack (32, 42) and/or the retro-stepped dielectric material portion 65, and optionally over the and lithographically patterned to form at least one backside contact trench 79 in an area in which formation of a backside contact via structure is desired. The pattern in the photoresist layer can be transferred through the alternating stack (32, 42) and/or the retro-stepped dielectric material portion 65 employing an anisotropic etch to form the at least one backside contact trench 79, which extends at least to the top surface of the substrate (9, 10). In one embodiment, the at least one backside contact trench 79 can include a source contact opening in which a source contact via structure can be subsequently formed. If desired, a source region (not shown) may be formed by implantation of dopant atoms into a portion of the semiconductor material layer 10 through the backside contact trench 79.

An etchant that selectively etches the second material of the sacrificial material layers 42 with respect to the first material of the insulator layers 32 can be introduced into the at least one backside contact trench 79, for example, employing an etch process. Backside recesses 43 are formed in volumes from which the sacrificial material layers 42 are removed. The removal of the second material of the sacrificial material layers 42 can be selective to the first material of the insulator layers 32, the material of the at least one dielectric support pillar 7P, the material of the retro-stepped dielectric material portion 65, the semiconductor material of the semiconductor material layer 10, and the material of the outermost layer of the memory films 50. In one embodiment, the sacrificial material layers 42 can include silicon nitride, and the materials of the insulator layers 32, the at least one dielectric support pillar 7P, and the retro-stepped dielectric material portion 65 can be selected from silicon oxide and dielectric metal oxides. In another embodiment, the sacrificial material layers 42 can include a semiconductor material such as polysilicon, and the materials of the insulator layers 32, the at least one dielectric support pillar 7P, and the retro-stepped dielectric material portion 65 can be selected from silicon oxide, silicon nitride, and dielectric metal oxides. In this case, the depth of the at least one backside contact trench 79 can be modified so that the bottommost surface of the at least one backside contact trench 79 is located within the dielectric pad layer 12, i.e., to avoid physical exposure of the top surface of the semiconductor substrate layer 10.

The etch process that removes the second material selective to the first material and the outermost layer of the memory films 50 can be a wet etch process employing a wet etch solution, or can be a gas phase (dry) etch process in which the etchant is introduced in a vapor phase into the at least one backside contact trench 79. For example, if the sacrificial material layers 42 include silicon nitride, the etch process can be a wet etch process in which the exemplary structure is immersed within a wet etch tank including phosphoric acid, which etches silicon nitride selective to silicon oxide, silicon, and various other materials employed in the art. The at least one dielectric support pillar 7P, the retro-stepped dielectric material portion 65, and the memory stack structures 55 provide structural support while the backside recesses 43 are present within volumes previously occupied by the sacrificial material layers 42.

Each backside recess 43 can be a laterally extending cavity having a lateral dimension that is greater than the vertical extent of the cavity. In other words, the lateral dimension of each backside recess 43 can be greater than the height of the backside recess 43. A plurality of backside recesses 43 can be formed in the volumes from which the second material of the sacrificial material layers 42 is removed. The memory openings in which the memory stack structures 55 are formed are herein referred to as front side recesses or front side cavities in contrast with the backside recesses 43. In one embodiment, the device region 100 comprises an array of monolithic three-dimensional NAND strings having a plurality of device levels disposed above the substrate (9, 10). In this case, each backside recess 43 can define a space for receiving a respective word line of the array of monolithic three-dimensional NAND strings.

Each of the plurality of backside recesses 43 can extend substantially parallel to the top surface of the substrate (9, 10). A backside recess 43 can be vertically bounded by a top surface of an underlying insulator layer 32 and a bottom surface of an overlying insulator layer 32. In one embodiment, each backside recess 43 can have a uniform height throughout. Optionally, a backside blocking dielectric layer can be formed in the backside recesses.

Referring to FIG. 6A, a vertical cross-sectional magnified view of a magnified region M in FIGS. 5A and 5B is illustrated, which includes a portion of the backside contact trench 79 and a plurality of backside recesses 43. In one embodiment, a sidewall surface of at least one blocking dielectric (501, 503) can be physically exposed at end portions of backside recesses 43. The sidewall surface of the at least one blocking dielectric (501, 503) is an outer sidewall surface of a memory film 50 illustrated in FIG. 2F.

Referring to FIG. 6B, a processing step for forming first exemplary electrically conductive layers is illustrated. Specifically, ruthenium nucleation portions 461A can be deposited selectively only on physically exposed surfaces of at least one blocking dielectric (501, 503) without growing from the surfaces of the insulator layers 32. Deposition of the ruthenium nucleation portions 461A can be performed by atomic layer deposition (ALD) in which a volatile ruthenium precursor, such as $RuO_4$, is supplied into a reaction chamber in which the exemplary structure is placed. One or more $RuO_2$ monolayers may be formed using atomic layer deposition. The one or more $RuO_2$ monolayers may be exposed to a reducing atmosphere to fully reduce the deposited one or more $RuO_2$ monolayers to one or more Ru monolayers. The $RuO_2$ deposition and Ru reducing steps (i.e., 1 atomic layer deposition (ALD) cycle) may be repeated multiple times. A hydrogen based forming gas, such as 2%-5% (such as 4%) hydrogen and 95%-98% (such as 96%) nitrogen, may be supplied as the reducing atmosphere for the ruthenium. In one embodiment, the atomic layer deposition is performed by cycling, such as with less than 25 cycles (such as 10 cycles-25 cycles) to form contiguous portions of Ru, each of which constitutes a ruthenium nucleation portions 461A.

ALD is a surface sensitive deposition process, i.e., the film growth is strongly dependent on the substrate's surface characteristics. Without wishing to be bound by a particular theory, it is conjectured that the difference in nucleation is a function of the hydrophobicity of the surfaces, which results in different contact angles for different surfaces. That is, the more hydrophilic the surface, the lower contact angle. Further, a lower contact angle results in a thinner film region. In one embodiment, the outer sidewall of the at least one blocking dielectric (501, 503) can be a more hydrophobic than the surfaces of the insulator layers 32. In this case, the thickness of the ruthenium layer 461L can be greater at vertical portions of the ruthenium layer 461L that contacts the at least one blocking dielectric (501, 503) than at horizontal portions that contact horizontal surfaces of the insulator layers 32.

Empirically, it has been observed that in case the insulator layers 32 comprise silicon oxide, less than 25 cycles of $RuO_2$ deposition steps and Ru reduction steps results in discontinuous islands of ruthenium on the surfaces of the insulator layers 32, while continuous portions of ruthenium can be formed on hydrophobic surfaces such as silicon nitride surfaces. The deposited ruthenium material forms the ruthenium nucleation portions 461A, each of which is a continuous material portion located within a backside recess 43. A recess cavity 43' is present in each volume of a backside recess 43 that is not occupied by the ruthenium layer 461L.

In one embodiment, the outer surface of the first blocking dielectric layer 501 can be a material less hydrophilic than silicon oxide, such as silicon nitride, and the insulator layers 32 can include silicon oxide. With less than 25 cycles of the ALD process, ruthenium does not form any contiguous material portion on surfaces of the insulator layer 32, and grows only from the outer sidewalls of the first blocking dielectric layer 501. The thickness of each ruthenium nucleation portion 461A in contact with the outer surface of the first blocking dielectric layer 501 can be in a range from 1 nm to 10 nm, although lesser and greater thicknesses can also be employed. The ruthenium nucleation portions 461A can consist essentially of ruthenium. The impurity contents in the ruthenium nucleation portions 461A can be determined by the impurity level of the reactant gas, i.e., in the $RuO_4$ gas, and can be less than 10 parts per million (p.p.m.) or less than 1 p.p.m.

Thus, the ruthenium material portions 461 are not present on the surfaces of the insulator layer 32 that are laterally spaced from the outer sidewall of the at least one blocking dielectric (501, 503) by a distance greater than the thickness of the ruthenium nucleation portions 461A. Each ruthenium nucleation portion 461A is formed directly on an outer sidewall of the memory film 50, which can be the outer sidewall of the at least one blocking dielectric (501, 503). Each ruthenium nucleation portion 461A can be formed by depositing ruthenium on a sidewall of the memory film 50, while ruthenium does not grow from surfaces of the insulator layers 32. Each ruthenium nucleation portion 461A laterally surrounds, and encloses, the memory film 50. Each ruthenium nucleation portion 461A can have an annular shape, i.e., can be topologically homeomorphic to a torus. As used herein, an element is homeomorphic to a geometrical shape if the shape of the element can be mapped to the geometrical shape by continuous deformation without creation or destruction of any hole. Each ruthenium nucleation portion 461A is deposited within one level of the stack, and does not adjoin other ruthenium nucleation portions 461A located at any other level of the stack after formation of the ruthenium nucleation portions 461A.

In another embodiment, the outer surface of the first blocking dielectric layer 501 can be a material having a same, or comparable, hydrophobicity as silicon oxide, such as silicon oxide or aluminum oxide, and the insulator layers 32 can include silicon oxide. In this case, formation of a continuous ruthenium layer having a substantially uniform thickness may occur on the surfaces of the memory film 50 and the insulator layers 32 in lieu of formation of the ruthenium nucleation portions 461A.

Figure 6D:
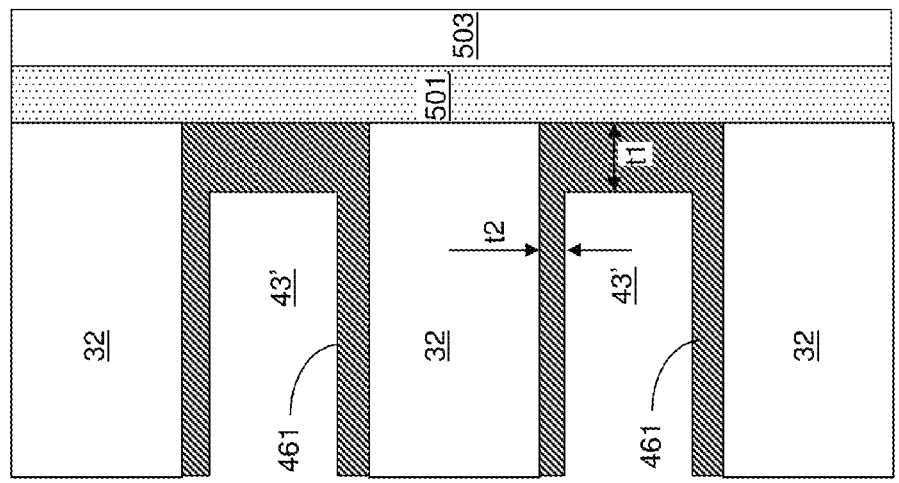
Figure 6C:
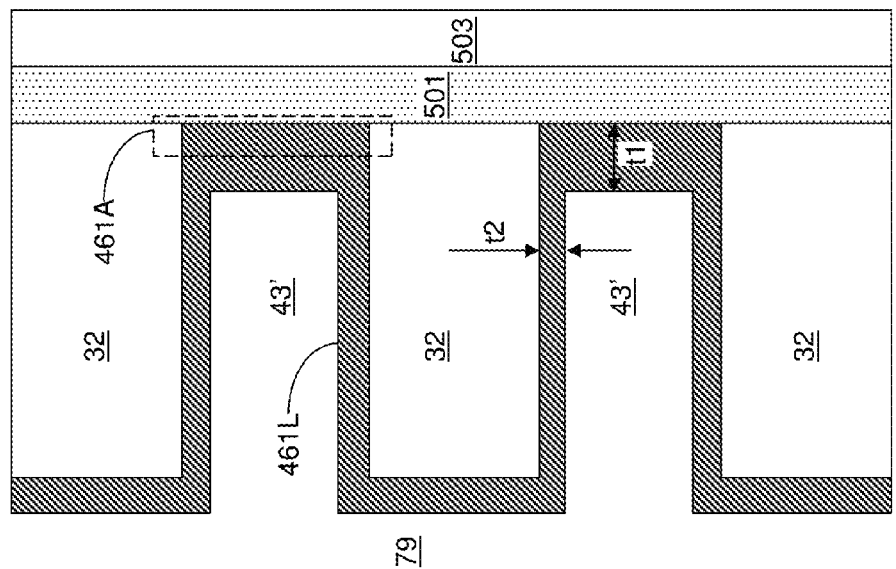

Referring to FIG. 6C, the ALD process can continue to add additional cycles so that the total number of cycles in the ALD process exceeds 25. A ruthenium layer 461L can be deposited on each physically exposed sidewall surface of the at least one blocking dielectric (501, 503), and each physically exposed surface of the insulator layers 32 that are present around the backside recesses 43 and around the backside contact trench 79. A contiguous strip of ruthenium is deposited to form the ruthenium layer by employing more than 25 cycles (such as 25 cycles-40 cycles) during the ALD process. Alternatively, a chemical vapor deposition process (such as a metal-organic chemical vapor deposition (MOCVD) process) can be employed to deposit ruthenium in lieu of an ALD process.

In one embodiment, the outer surface of the first blocking dielectric layer 501 can be a material less hydrophilic than silicon oxide, such as silicon nitride, and the insulator layers 32 can include silicon oxide. In this case, the thickness of the vertical portions of the ruthenium layer 461L in contact with the outer surface of the first blocking dielectric layer 501 can be in a range from 3 nm to 12 nm (e.g., 3 nm to 10 nm such as 5 nm to 7 nm), and the thickness of the portions of the ruthenium layer 461L in contact with surfaces of the insulator layer 32 can be in a range from 1 nm to 7 nm. Typically, the thickness differential between the vertical portions of the ruthenium layer 461L and the horizontal portions of the ruthenium layer 461L is about 4 nm. The ruthenium layer 461L can consist essentially of ruthenium. The impurity contents in the ruthenium layer 461L can be determined by the impurity level of the reactant gas, i.e., in the $RuO_4$ gas, and can be less than 10 parts per million (p.p.m.) or less than 1 p.p.m.

In one embodiment, the outer surface of the first blocking dielectric layer 501 can be a material less hydrophilic (i.e., more hydrophobic) than silicon oxide, such as silicon nitride, and the insulator layers 32 can include silicon oxide. Up to about 25 cycles of the ALD process, ruthenium does not form any contiguous material portion on surfaces of the insulator layer 32, and grows only from the outer sidewalls of the first blocking dielectric layer 501. A ruthenium nucleation portion 461A can be deposited on a sidewall of the memory film 50 within each backside recess, while not growing from surfaces of the insulator layers 32 during a first step of a ruthenium deposition process that corresponds to less than about the 25-th cycle of the ALD process. Additional ruthenium material is deposited on the ruthenium nucleation portions 461A and on the surfaces of the insulator layers 32 during a second step of the ruthenium deposition process to add additional ruthenium material to the ruthenium nucleation portions 461A and to form the ruthenium layer 461L.

In one embodiment, the outer surface of the first blocking dielectric layer 501 can be a material less hydrophilic than silicon oxide, such as silicon nitride, and the insulator layers 32 can include silicon oxide. In this case, the first thickness t1 of the vertical portions of the ruthenium layer 461L in contact with the outer surface of the first blocking dielectric layer 501 can be in a range from 3 nm to 12 nm, and the second thickness t2 of the portions of the ruthenium layer 461L in contact with surfaces of the insulator layer 32 can be less than the first thickness t1, and can be in a range from 1 nm to 7 nm. The ruthenium layer 461L can consist essentially of ruthenium. The impurity contents in the ruthenium layer 461L can be determined by the impurity level of the reactant gas, i.e., in the $RuO_4$ gas, and can be less than 10 parts per million (p.p.m.) or less than 1 p.p.m.

In another embodiment, the outer surface of the first blocking dielectric layer 501 can be a material having a same, or comparable, hydrophobicity as silicon oxide, such as silicon oxide or aluminum oxide, and the insulator layers 32 can include silicon oxide. In this case, the ruthenium layer 461 can be formed directly on the surfaces of the memory film 50 and the insulator layers 32 with a substantially uniform thickness throughout. In this case, the first thickness t1 and the second thickness t2 can be the same. The uniform thickness of the ruthenium layer 461 can be in a range from 3 nm to 12 nm, although lesser and greater thicknesses can also be employed.

Referring to FIG. 6D, an anisotropic etch is performed to remove vertical portions of the ruthenium layer 461L from the sidewalls of the insulator layers 32 and a horizontal bottom surface of the backside contact trench 79. In one embodiment, the backside contact trench 79 can be formed with a finite taper angle, which can be in a range from 0.2 degrees to 3 degrees. A taper, if present in the sidewalls of the backside contact trench 79, can be advantageously employed to facilitate the removal of the vertical portions of the ruthenium layer 461L from the sidewalls of the insulator layers 32.

The sidewalls of the insulator layers 32 are physically exposed after the anisotropic etch at the periphery of the backside contact trench 79. Each remaining discrete portion of the ruthenium layer 461L within a backside recess constitutes a ruthenium portion 461. In one embodiment, each ruthenium portion 461 can include a vertical portion having the first thickness t1, and horizontal portions having the second thickness t2, which is less than the first thickness t1.

Each ruthenium portion 461 can be formed on a bottom surface of an overlying insulator layer 32 above each respective backside recess, and on a top surface of an underlying insulator layer 32 below each respective backside recess. Each ruthenium portion 461 can include a vertical portion contacting the memory film 50 and a pair of horizontal portions laterally extending from the vertical portion and vertically spaced from each other. The pair of horizontal portions has a uniform thickness, which is the second thickness t2, that is less than a thickness of the vertical portion, i.e., the first thickness t1. Alternatively, the outer surface of the memory film 50 can have the same composition as the insulator layers 32 (e.g., silicon oxide), and the first thickness t1 can be the same as the second thickness t2. Each ruthenium portion 461 is formed within one level of the stack, and does not adjoin other ruthenium portions 461 located at any other level of the stack after formation of the ruthenium portions 461.

Figure 6E:
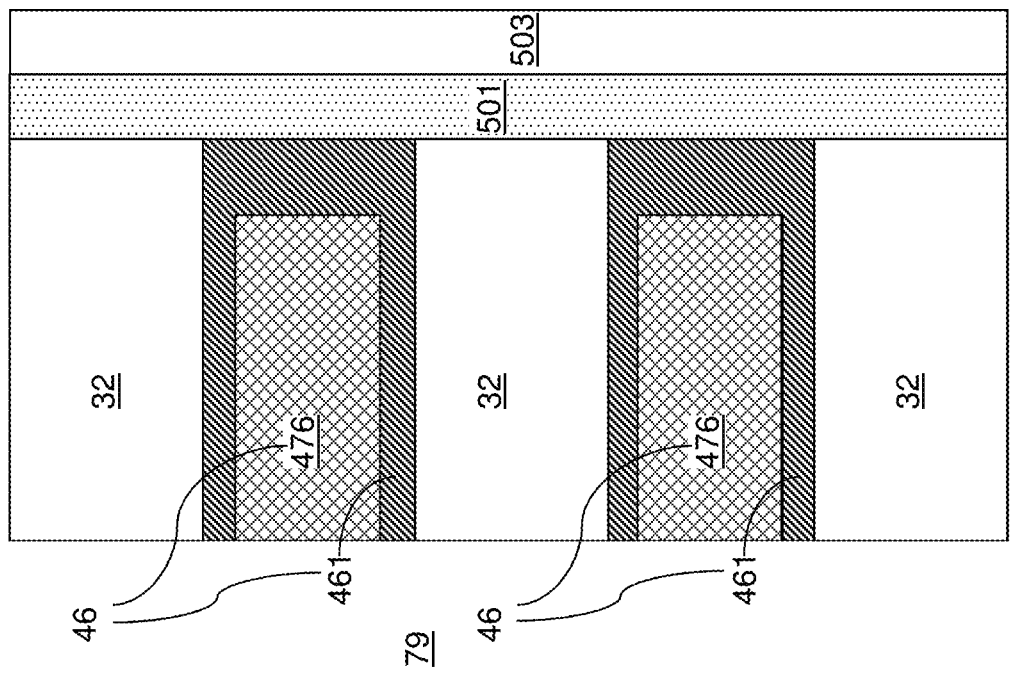

Referring to FIG. 6E, a conductive material can be deposited on each ruthenium portion 461 by a selective deposition process, which can be a chemical vapor deposition process. The conductive material can be a material other than ruthenium. The conductive material can be selected such that deposition of the conductive material does not occur directly on the dielectric material of the insulator layers 32, but proceeds from the surfaces of the ruthenium portions 461 employing the ruthenium portions 461 as a seeding layer. Thus, the conductive material grows only from surfaces of the ruthenium portions 461 from within each backside recess to form conductive material portions 476. The growth of each conductive material portion 476 proceeds from the physically exposed surfaces of the ruthenium portions 461, and does not proceed from surfaces of the insulator layers 32 during formation of the conductive material portions 476.

Each conductive material portion 476 is spaced from an overlying insulator layer 32 and an underlying insulator layer 32 by the thickness of a horizontal sub-portion of a ruthenium portion 461. The duration of the deposition process that deposits the conductive material of the conductive material portions 476 can be selected so that each conductive material portion 476 fills the backside recess 43' and extends into a portion of the backside contact trench 79. Optionally, an anisotropic etch can be performed to remove sub-portions of the conductive material portions 476 that protrude into the backside contact trench 79. In this case, a sidewall of each conductive material portion 476 can be substantially vertically coincident with sidewalls of the backside contact trench 79.

In one embodiment, the conductive material can be tungsten that is deposited by reduction of $WF_6$ in hydrogen. In this case, the deposited conductive material can consist essentially of tungsten. Particularly, the deposited conductive material can be free of silicon or boron, which is necessarily present in a tungsten seed layer formed by reduction of $WF_6$ with silane, dichlorosilane, or diborane.

While reduction of $WF_6$ with silane, dichlorosilane, or diborane provides a conformally nucleated film that is deposited on all types of surfaces, the resulting film includes not only tungsten, but also includes silicon or boron in a significant quantity that exceeds, for example, 1 p.p.m. or more, and in some cases 10 p.p.m. or more. Further, the layer derived from reduction of $WF_6$ with silane, dichlorosilane, or diborane is amorphous, and has a resistivity that is about ten times higher than tungsten film derived from reduction of $WF_6$ with hydrogen. In contrast, tungsten derived by reduction of $WF_6$ in hydrogen is selectively deposited only on metallic surfaces, such as the ruthenium portions, and does not grow from dielectric surfaces such as the surfaces of the insulator layers 32, which can be, for example, silicon oxide surfaces, exposed in the trench.

Tungsten that is deposited by reduction of $WF_6$ in hydrogen is polycrystalline, thereby providing a lower resistivity than a tungsten alloy layer containing silicon or boron, and formed by reduction of $WF_6$ with silane, dichlorosilane, or diborane. Thus, deposition of tungsten by reduction of $WF_6$ in hydrogen provides a high purity tungsten portion consisting essentially of tungsten and providing a low bulk resistivity. In one embodiment, the entirety of each conductive material portion 476 can comprise polycrystalline tungsten having a same average grain size throughout. Alternatively, $WCl_6$ may be employed in lieu of $WF_6$.

In one embodiment, each ruthenium portion 461 comprises ruthenium, and is formed within a respective backside recess, and each conductive material portion 476 comprises a material other than ruthenium, and is formed on a surface of a ruthenium portion 461. Each conductive material portion 476 is formed directly on a sidewall of a ruthenium portion 461. Each adjoining pair of a ruthenium portion 461 and a conductive material portion 476 collectively constitutes an electrically conductive layer 46.

A set of alternative processing steps may be performed in lieu of the processing steps of FIGS. 6B-6E. Referring to FIG. 7A, a contiguous electrically conductive barrier layer 481L can be deposited on each physically exposed sidewall surface of the at least one blocking dielectric layer (501, 503), and each physically exposed surface of the insulator layers 32 that are present around the backside recesses 43 and around the backside contact trench 79 on the structure illustrated in FIG. 6A. The contiguous electrically conductive barrier layer 481L can be a metallic material layer (e.g., a metallic nitride layer) such as TiN, TaN, WN, an alloy thereof, or a stack thereof. The contiguous electrically conductive barrier layer 481L can be deposited by a conformal deposition process such as by chemical vapor deposition or atomic layer deposition. The contiguous electrically conductive barrier layer 481L can nucleate uniformly on all dielectric surfaces, and can have the same thickness throughout. The contiguous electrically conductive barrier layer 481L can be formed as a contiguous material layer that extends through the entirety of the backside contact trench 79. The thickness of the contiguous electrically conductive barrier layer 481L can be in a range from 2 nm to 10 nm, although lesser and greater thicknesses can also be employed.

The first blocking dielectric layer 501 may, or may not, be an aluminum oxide layer. Further, the contiguous electrically conductive barrier layer 481L may be omitted (as illustrated in 5A, 5B, and 6A-6E), or may be present (as illustrated in FIG. 7A).

Figure 7B:
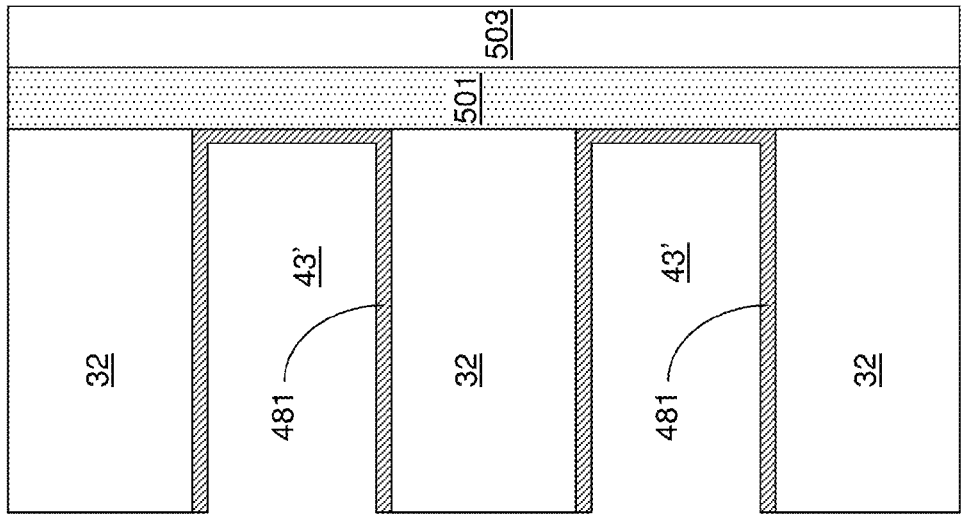
FIGS. 7A-7D are sequential vertical cross-sectional views of a magnified region M in FIGS. 5A and 5B during formation of second exemplary electrically conductive layers according to a second embodiment of the present disclosure.
Figure 7A:
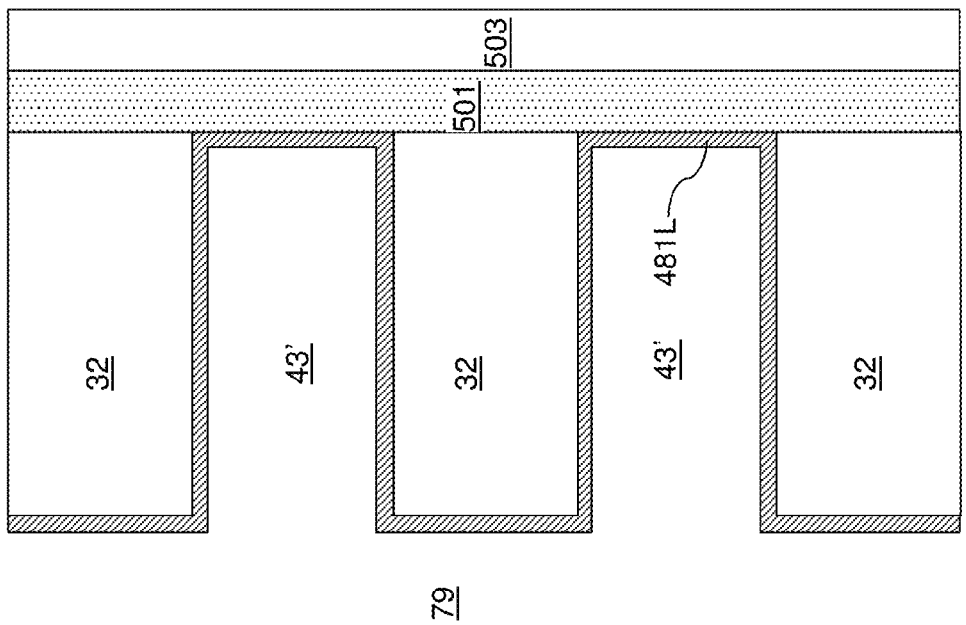

Referring to FIG. 7B, an anisotropic etch is performed to remove vertical portions of the contiguous electrically conductive barrier layer 481L from the sidewalls of the insulator layers 32 and a horizontal bottom surface of the backside contact trench 79. The anisotropic etch removes the vertical portions of the contiguous electrically conductive barrier layer 481L without removing the portions of the contiguous electrically conductive barrier layer 481L located within the backside recesses. In the course of research leading to the present disclosure, the inventors demonstrated feasibility of such an anisotropic etch process employing a TiN/WN liner as the conductive electrically conductive barrier layer 481L. In one embodiment, the backside contact trench 79 can be formed with a finite taper angle, which can be in a range from 0.2 degrees to 3 degrees. A taper, if present in the sidewalls of the backside contact trench 79, can be advantageously employed to facilitate the removal of the vertical portions of the contiguous electrically conductive barrier layer 481L from the sidewalls of the insulator layers 32.

The sidewalls of the insulator layers 32 are physically exposed after the anisotropic etch at the periphery of the backside contact trench 79. Each remaining discrete portion of the contiguous electrically conductive barrier layer 481L within a backside recess constitutes an electrically conductive liner 481, which can be a metallic liner. Each electrically conductive liner 481 can be formed on a bottom surface of an overlying insulator layer 32 above each respective backside recess, on a top surface of an underlying insulator layer 32 below each respective backside recess, and on an outer sidewall of the memory film 50. Each electrically conductive liner 481 can include a vertical portion contacting the memory film 50 and a pair of horizontal portions laterally extending from the vertical portion and vertically spaced from each other. In one embodiment, the entirety of each electrically conductive liner 481 can have the same thickness throughout.

Figure 7D:
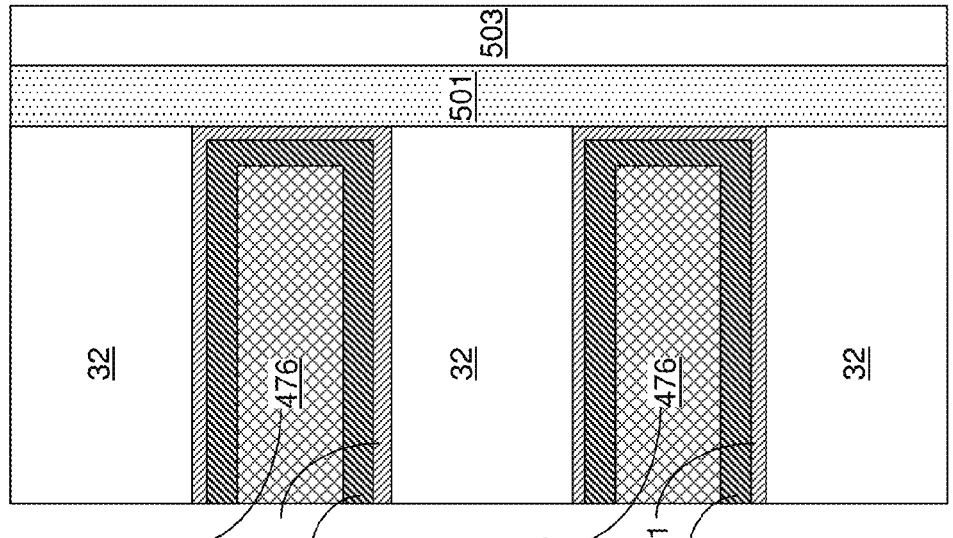
Figure 7C:
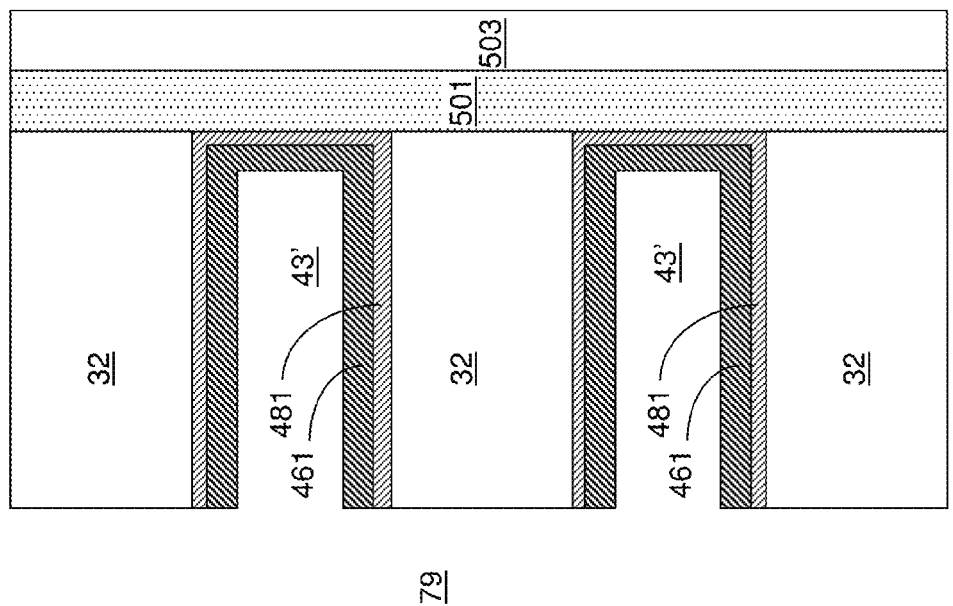

Referring to FIG. 7C, ruthenium portions 461 can be deposited selectively only on physically exposed surfaces of each electrically conductive liner 481 without growing from the surfaces of the insulator layers 32. Deposition of the ruthenium portions 461 can be performed by supplying a volatile ruthenium precursor, such as $RuO_4$ into a reaction chamber in which the exemplary structure is placed, and reducing the deposited ruthenium-oxygen compound by exposing it to a reducing atmosphere to one or more Ru monolayers as described above. In one embodiment, the atomic layer deposition is performed by cycling, such as with less than 25 cycles (such as 10 cycles-25 cycles) to form contiguous portions of Ru, each of which constitutes a ruthenium portion 461.

The difference in nucleation rates provided by the surfaces of the electrically conductive liners 481 and the surfaces of the insulator layers 32 causes the ruthenium portions 461 to grow only from the surfaces of the electrically conductive liners 481, while growth from the insulator layers 32 is suppressed during the steps of the ALD process provided that the number of cycles in the ALD process is less than about 25. Each deposited ruthenium material portion constitutes a ruthenium portions 461 located within a backside recess. A recess cavity 43' is present in each volume of a backside recess that is not occupied by the electrically conductive liner 481 or the ruthenium portion 461.

The thickness of each ruthenium portion 461 can be in a range from 3 nm to 10 nm (e.g., 5 nm to 7 nm), although lesser and greater thicknesses can also be employed. The ruthenium portions 461 can consist essentially of ruthenium. The impurity contents in the ruthenium portions 461 can be determined by the impurity level of the reactant gas, i.e., in the RuO4 gas, and can be less than 10 parts per million (p.p.m.) or less than 1 p.p.m. Each ruthenium portion 461 is formed directly on surfaces of an electrically conductive liner 481, while ruthenium does not grow from surfaces of the insulator layers 32. Each ruthenium portion 461 laterally surrounds, and encloses, the memory film 50. Each ruthenium portion 461 is deposited within one level of the stack, and does not adjoin other ruthenium portions 461 located at any other level of the stack after formation of the ruthenium portions 461.

Referring to FIG. 7D, a conductive material can be deposited on each ruthenium portion 461 by a selective deposition process, which can be a chemical vapor deposition process. The conductive material can be a material other than ruthenium. The conductive material can be selected such that deposition of the conductive material does not occur directly on the dielectric material of the insulator layers 32, but proceeds from the surfaces of the ruthenium portions 461 employing the ruthenium portions 461 as a seeding layer. Thus, the conductive material grows only from surfaces of the ruthenium portions 461 from within each backside recess to form conductive material portions 476. The growth of each conductive material portion 476 proceeds from the physically exposed surfaces of the ruthenium portions 461, and does not proceed from surfaces of the insulator layers 32 during formation of the conductive material portions 476.

Each conductive material portion 476 is spaced from an overlying insulator layer 32 and an underlying insulator layer 32 by the thickness of a horizontal sub-portion of a ruthenium portion 461. The duration of the deposition process that deposits the conductive material of the conductive material portions 476 can be selected so that each conductive material portion 476 fills the backside recess 43' and extends into a portion of the backside contact cavity 79. Optionally, an anisotropic etch can be performed to remove sub-portions of the conductive material portions 476 that protrude into the backside contact trench 79. In this case, a sidewall of each conductive material portion 476 can be substantially vertically coincident with sidewalls of the backside contact trench 79.

In one embodiment, the conductive material can be tungsten that is deposited by reduction of $WF_6$ in hydrogen. In this case, the deposited conductive material can consist essentially of tungsten. Tungsten that is deposited by reduction of $WF_6$ in hydrogen is polycrystalline, thereby providing a lower resistivity than a tungsten alloy layer containing silicon or boron, and formed by reduction of $WF_6$ with silane, dichlorosilane, or diborane. It is noted that amorphous tungsten deposited by reduction of $WF_6$ in silane, dichlorosilane, or diborane (known as a tungsten nucleation layer) would be needed if a TiN layer was present instead of a Ru layer. This is because conventional tungsten deposition requires sequential deposition of a TiN/WN barrier layer, an amorphous tungsten nucleation layer, and a main tungsten CVD fill layer including polycrystalline tungsten. By using a ruthenium layer on which polycrystalline tungsten is selectively deposited by reduction of $WF_6$ in hydrogen, the methods of the present disclosure removes the need for a tungsten nucleation layer deposition process. This simplifies integration and reduces resistivity of the deposited material since the high resistivity, amorphous tungsten nucleation layer deposited by reduction of $WF_6$ in silane, dichlorosilane, or diborane (and which contains silicon or boron) is preferably omitted from the structure. Thus, deposition of tungsten by reduction of $WF_6$ in hydrogen provides a high purity tungsten portion consisting essentially of tungsten and providing a low bulk resistivity. In one embodiment, the entirety of each conductive material portion 476 can comprise polycrystalline tungsten having a same average grain size throughout.

In one embodiment, each ruthenium portion 461 comprises ruthenium, and is formed within a respective backside recess, and each conductive material portion 476 comprises a material other than ruthenium and is formed on a surface of a ruthenium portion 461. Each conductive material portion 476 is formed directly on a sidewall of a ruthenium portion 461. Each adjoining set of an electrically conductive liner 481, a ruthenium portion 461, and a conductive material portion 476 collectively constitutes an electrically conductive layer 46.

Another set of alternative processing steps may be performed in lieu of the processing steps of FIGS. 6B-6E. Referring to FIG. 8A, a contiguous electrically conductive barrier layer 481L can be deposited on each physically exposed sidewall surface of the at least one blocking dielectric layer (501, 503), and each physically exposed surface of the insulator layers 32 that are present around the backside recesses 43 and around the backside contact trench 79 on the structure illustrated in FIG. 6A. The same processing step employed to form the structure of FIG. 7A can be employed.

Subsequently, ruthenium is conformally deposited on the surfaces of the contiguous electrically conductive barrier layer 481L as a contiguous material layer to form a ruthenium layer 461L. The ruthenium layer 461L can be deposited by an ALD process employing the methods described above. The number of cycles in the ALD process can be, for example, in a range from 10 cycles to 50 cycles, although lesser and greater numbers of cycles can also be employed. Because ruthenium nucleates on all physically exposed surfaces of the contiguous electrically conductive barrier layer 481L, the ruthenium layer 461L can have the same thickness throughout. The thickness of the ruthenium layer 461L can be in a range from 3 nm to 12 nm, although lesser and greater thicknesses can also be employed. The ruthenium layer 461L can consist essentially of ruthenium. The impurity contents in the ruthenium layer 461L can be determined by the impurity level of the reactant gas, i.e., in the $RuO_4$ gas, and can be less than 10 parts per million (p.p.m.) or less than 1 p.p.m.

Figure 8B:
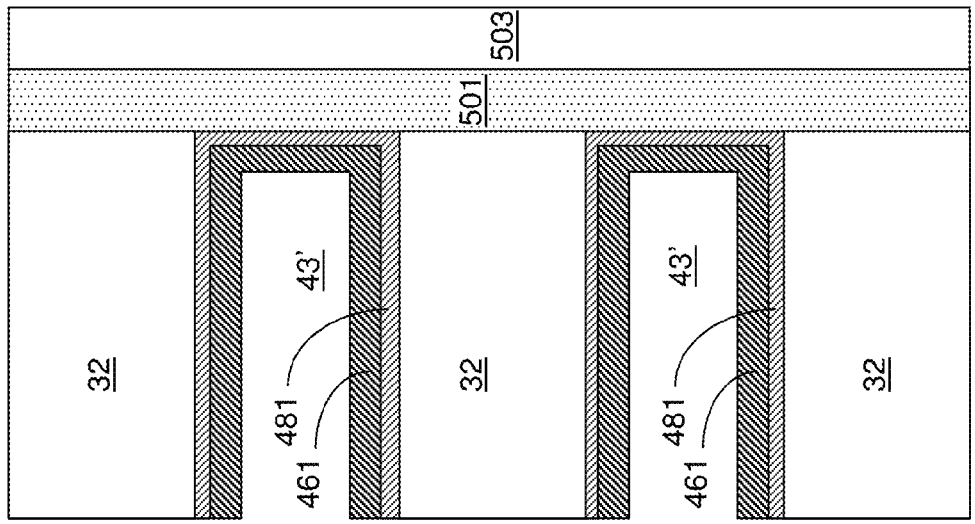
FIGS. 8A-8C are sequential vertical cross-sectional views of a magnified region M in FIGS. 5A and 5B during formation of third exemplary electrically conductive layers according to a third embodiment of the present disclosure.
Figure 8A:
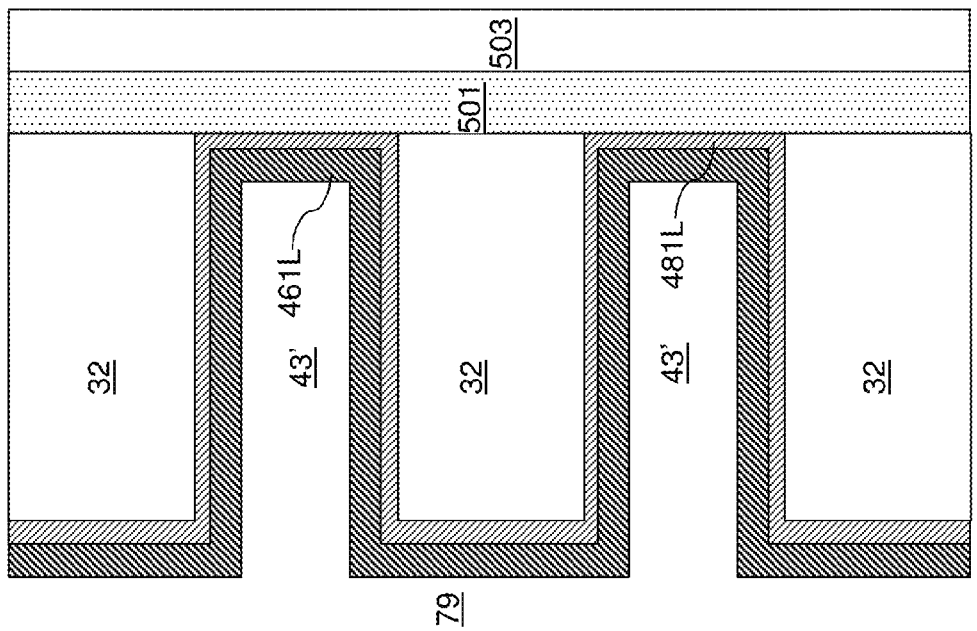

Referring to FIG. 8B, vertical portions of the ruthenium layer 461L and the contiguous electrically conductive liner 481L within the backside trench 79 are anisotropically etched. A reactive ion etch that is selective to the insulator material of the insulator layers 32 can be employed. Each remaining portion of the ruthenium layer 461L constitutes a ruthenium portion 461, and each remaining portion of the contiguous electrically conductive barrier layer 481L constitutes an electrically conductive liner 481. In one embodiment, the backside contact trench 79 can be formed with a finite taper angle, which can be in a range from 0.2 degrees to 3 degrees. A taper, if present in the sidewalls of the backside contact trench 79, can be advantageously employed to facilitate the removal of the vertical portions of the ruthenium layer 461L and the contiguous electrically conductive liner 481L from the sidewalls of the insulator layers 32.

The sidewalls of the insulator layers 32 are physically exposed after the anisotropic etch at the periphery of the backside contact trench 79. Each remaining discrete portion of the ruthenium layer 461L within a backside recess constitutes a ruthenium portion 461. Each remaining discrete portion of the contiguous electrically conductive barrier layer 481L constitutes an electrically conductive liner 481. In one embodiment, each ruthenium portion 461 can have a uniform thickness throughout the entirety thereof. Further, each electrically conductive liner 481 can have a uniform thickness through the entirety thereof. Each ruthenium portion 461 is deposited within one level of the stack, and does not adjoin other ruthenium portions 461 located at any other level of the stack after formation of the ruthenium portions 461.

Each electrically conductive liner 481 can be formed on a bottom surface of an overlying insulator layer 32 above each respective backside recess, and on a top surface of an underlying insulator layer 32 below each respective backside recess. Each ruthenium portion 461 can include a vertical portion contacting the memory film 50 and a pair of horizontal portions laterally extending from the vertical portion and vertically spaced from each other.

Figure 8C:
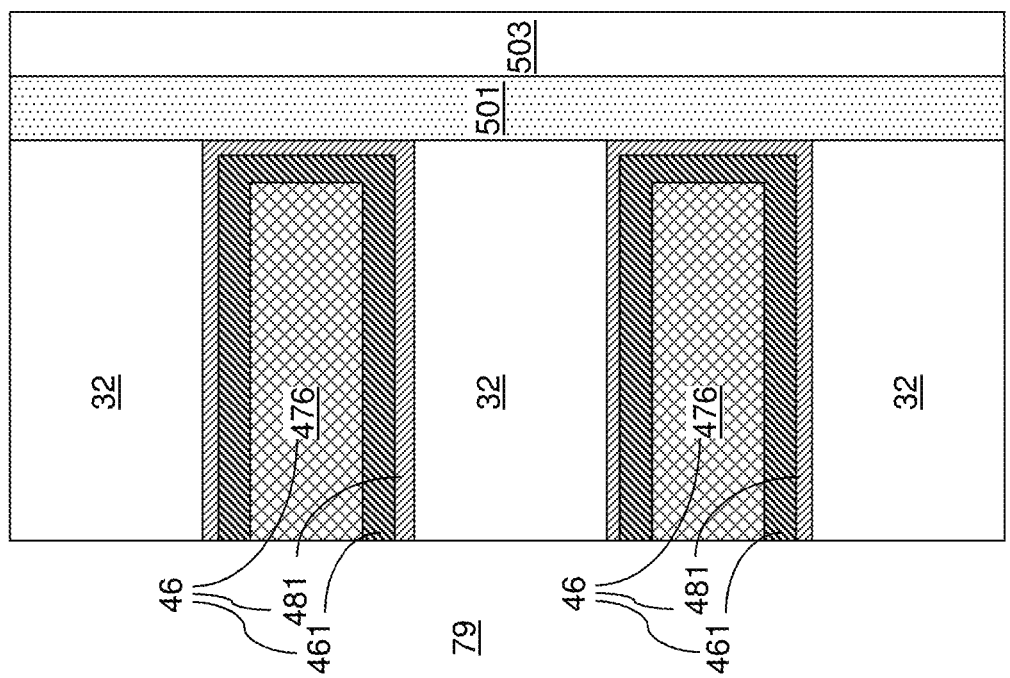

Referring to FIG. 8C, a conductive material can be deposited selectively on each ruthenium portion 461 by a selective deposition process, which can be a chemical vapor deposition process. The conductive material can be a material other than ruthenium. The conductive material can be selected such that deposition of the conductive material does not occur directly on the dielectric material of the insulator layers 32, but proceeds from the surfaces of the ruthenium portions 461 employing the ruthenium portions 461 as a seeding layer. Thus, the conductive material grows only from surfaces of the ruthenium portions 461 from within each backside recess to form conductive material portions 476. The growth of the conductive material proceeds laterally from a preexisting portion of the conductive material or one of the ruthenium portions 461, and does not proceed from surfaces of the insulator layers 32 during formation of the conductive material portions 476.

Each conductive material portion 476 contacts a bottom surface of an overlying insulator layer 32 and a top surface of an underlying insulator layer 32. The duration of the deposition process that deposits the conductive material of the conductive material portions 476 can be selected so that each conductive material portion 476 fills the entirety of a backside recess 43'. Optionally, an anisotropic etch can be performed to remove sub-portions of the conductive material portions 476 that protrude into the backside contact trench 79. In this case, a sidewall of each conductive material portion 476 can be substantially vertically coincident with sidewalls of the backside contact trench 79.

In one embodiment, the conductive material can be tungsten that is deposited by reduction of $WF_6$ in hydrogen. In this case, the deposited conductive material can consist essentially of tungsten. Particularly, the deposited conductive material can be free of silicon or boron, which is necessarily present in a tungsten seed layer formed by reduction of $WF_6$ with silane, dichlorosilane, or diborane. As discussed above, tungsten derived by reduction of $WF_6$ in hydrogen is deposited only on metallic surfaces, and does not grow from dielectric surfaces such as the surfaces of the insulator layers 32, which can be, for example, silicon oxide surfaces. Further, tungsten that is deposited by reduction of $WF_6$ in hydrogen is polycrystalline, thereby providing a lower resistivity than a tungsten alloy layer containing silicon or boron, and formed by reduction of $WF_6$ with silane, dichlorosilane, or diborane. Thus, deposition of tungsten by reduction of $WF_6$ in hydrogen provides a high purity tungsten portion consisting essentially of tungsten and providing a low bulk resistivity. In one embodiment, the entirety of each conductive material portion 476 can comprise polycrystalline tungsten having a same average grain size throughout.

In one embodiment, each ruthenium portion 461 comprises ruthenium, and is formed within a respective backside recess, and each conductive material portion 476 comprises a material other than ruthenium and is formed on a surface of a ruthenium portion 461. Each conductive material portion 476 is formed directly on a sidewall of a ruthenium portion 461. Each adjoining set of an electrically conductive liner 481, a ruthenium portion 461, and a conductive material portion 476 collectively constitutes an electrically conductive layer 46.

Figure 9:
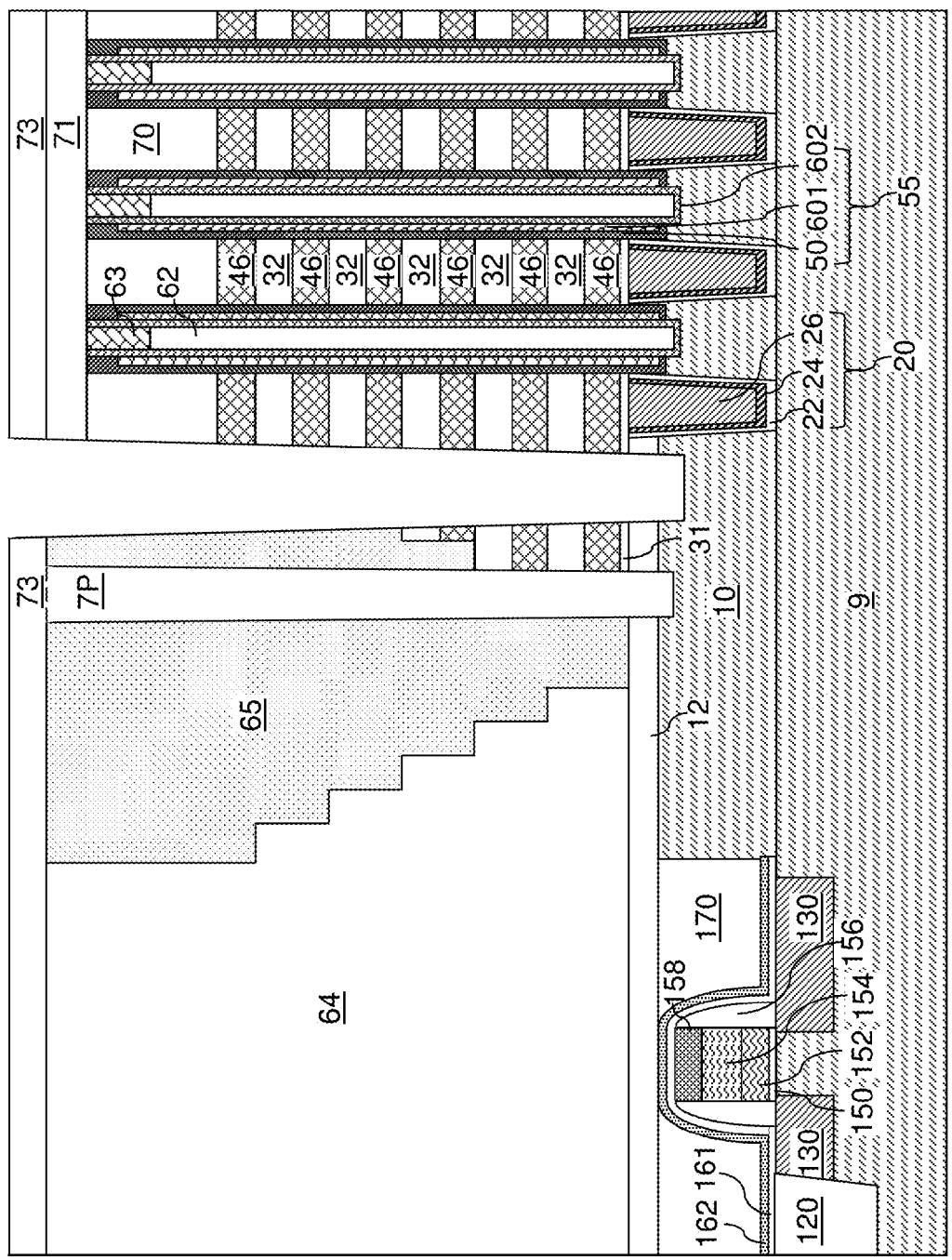
FIG. 9 is a vertical cross-sectional view of the exemplary structure after formation of electrically conductive lines according to an embodiment of the present disclosure.

Referring to FIG. 9, a plurality of electrically conductive layers 46 can be formed in the plurality of backside recesses 43. Thus, at least a portion of each sacrificial material layer 42 can be replaced with an electrically conductive layer 46, which is a conductive material portion. The electrically conductive layers 46 can have any type illustrated in FIGS. 6C, 7C, 8C, and 9C.

Each electrically conductive layer 46 can function as a combination of a plurality of control gate electrodes and a word line electrically connecting, i.e., electrically shorting, the plurality of control gate electrodes. The plurality of control gate electrodes within each electrically conductive layer 46 can include control gate electrodes located at the same level for the vertical memory devices including the memory stack structures 55. In other words, each electrically conductive layer 46 can be a word line that functions as a common control gate electrode for the plurality of vertical memory devices.

Figure 10:
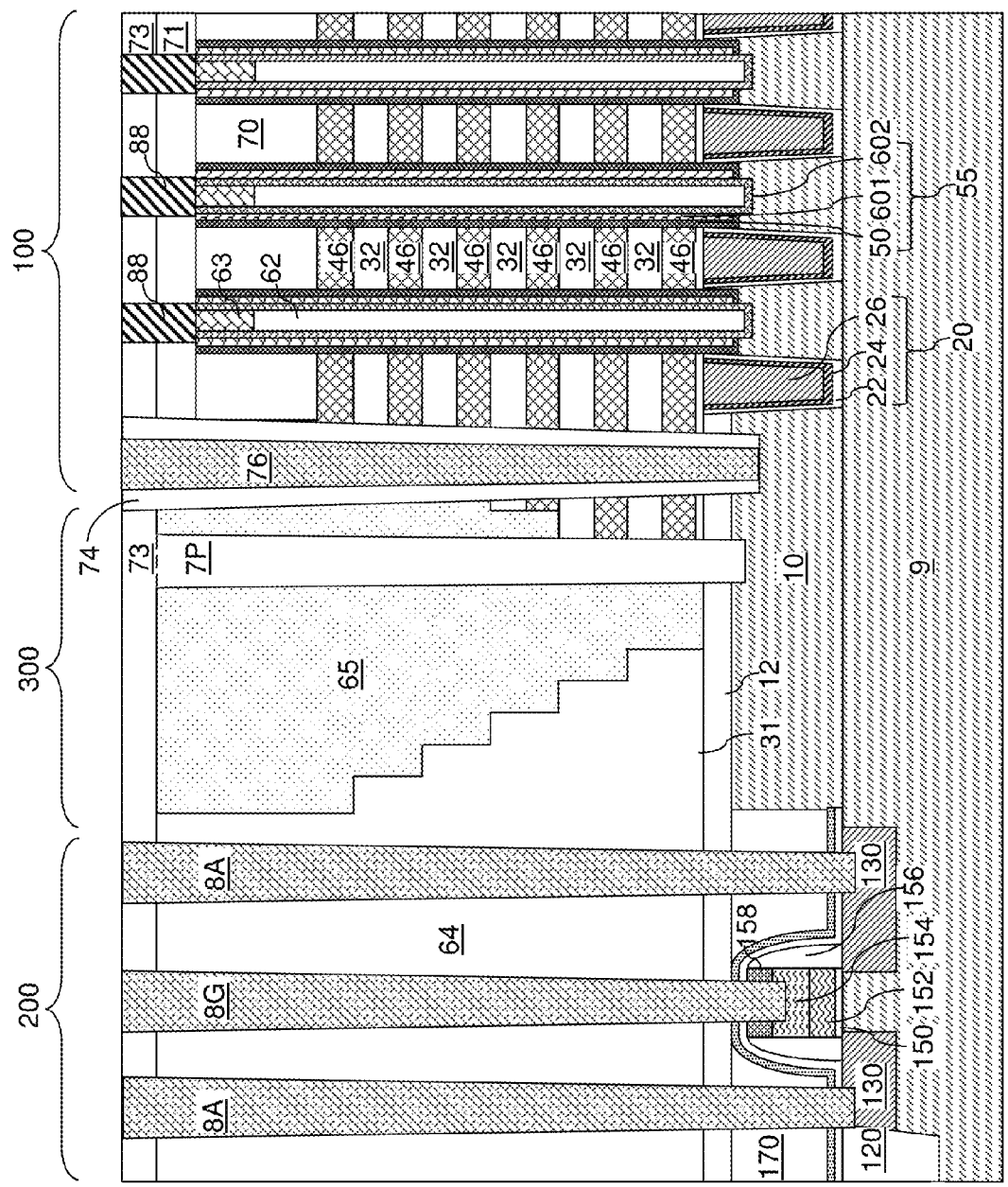
FIG. 10 is a vertical cross-sectional view of the exemplary structure after formation of a backside via space and a backside contact via structure according to an embodiment of the present disclosure.

Referring to FIG. 10, an insulating spacer 74 can be formed on the sidewalls of the backside contact trench 79 by deposition of a contiguous dielectric material layer and an anisotropic etch of its horizontal portions. The insulating spacer 74 includes a dielectric material, which can comprise, for example, silicon oxide, silicon nitride, a dielectric metal oxide, a dielectric metal oxynitride, or a combination thereof. The thickness of the insulating spacer 74, as measured at a bottom portion thereof, can be in a range from 1 nm to 50 nm, although lesser and greater thicknesses can also be employed. In one embodiment, the thickness of the insulating spacer 74 can be in a range from 3 nm to 10 nm.

A photoresist layer (not shown) can be applied over the topmost layer of the exemplary structure (which can be, for example, the dielectric pillar material layer 73) and in the cavity laterally surrounded by the insulating spacer 74, and is lithographically patterned to form various openings in a peripheral device region. The locations and the shapes of the various openings are selected to correspond to electrical nodes of the semiconductor devices in the peripheral device region 200 to be electrically contacted by contact via structures. An anisotropic etch is performed to etch through the various layers overlying the electrical nodes of the semiconductor devices. For example, at least one gate via cavity can be formed such that the bottom surface of each gate via cavity is a surface of a gate electrode (152, 154), and at least one active region via cavity can be formed such that the bottom surface of each active region via cavity is a surface of an active region 130. In one embodiment, different types of via cavities can be formed separately employing multiple combinations of photoresist layers and anisotropic etch processes. The vertical extent of each gate via cavity, as measured from the top surface of the dielectric pillar material layer 73 to the bottom surface of the gate via cavity, can be less than the vertical distance between the top surface of the dielectric pillar material layer 73 and the topmost surface of the alternating plurality (32, 46) of the insulator layers 32 and the electrically conductive layers 46. The photoresist layer can be subsequently removed, for example, by ashing.

Another photoresist layer (not shown) can be applied over the exemplary structure, and can be lithographically patterned to form openings within the contact region 200 in which formation of contact via structures for the electrically conductive layers 46 is desired. Control gate contact via cavities can be formed through the retro-stepped dielectric material portion 65 by transfer of the pattern of the opening by an anisotropic etch. Each via cavity can vertically extend to a top surface of a respective electrically conductive layer 46.

In addition, another photoresist layer (not shown) can be applied over the exemplary structure, and can be lithographically patterned to form openings that overlie the array of drain regions 63 in the device region 100. Drain contact via cavities can be formed through the dielectric pillar material layer 73 and the at least one dielectric cap layer 71.

The cavity laterally surrounded by the insulating spacer 74, the various via cavities in the peripheral device region 200, the control gate contact via cavities in the contact region 300, and the drain contact via cavities in the device region 100 can be filled with a conductive material to form various contact via structures. For example, a backside contact via structure 76 can be formed in the cavity surrounded by the insulating spacer 74. A gate contact via structure 8G can be formed in each gate via cavity in the peripheral device region 200. An active region via structure 8A is formed in each active region via cavity in the peripheral device region 200. Drain contact via structures 88 can be formed in the drain contact via cavities in the device region 100. Further, control gate contact via structures (not shown) can be formed within each contact via cavity that extends to a top surface of the electrically conductive layers 46 in the contact region 300. Similarly, drain contact via structures 88 can be formed to provide electrical contact to the drain regions 63.

Figure 11A:
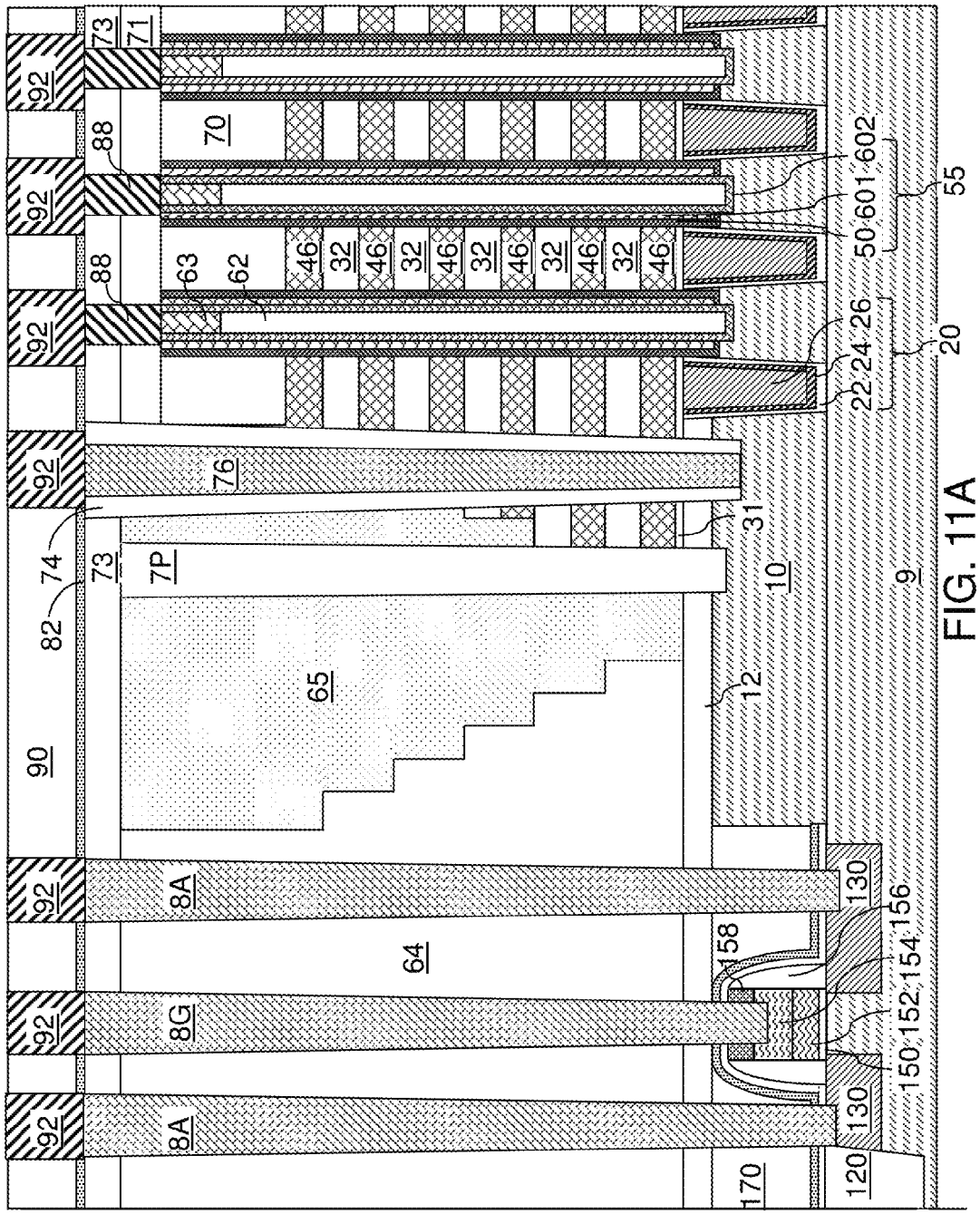
FIGS. 11A and 11B are vertical cross-sectional views of regions of the exemplary structure after formation of conductive line structures according to an embodiment of the present disclosure.
Figure 11B:
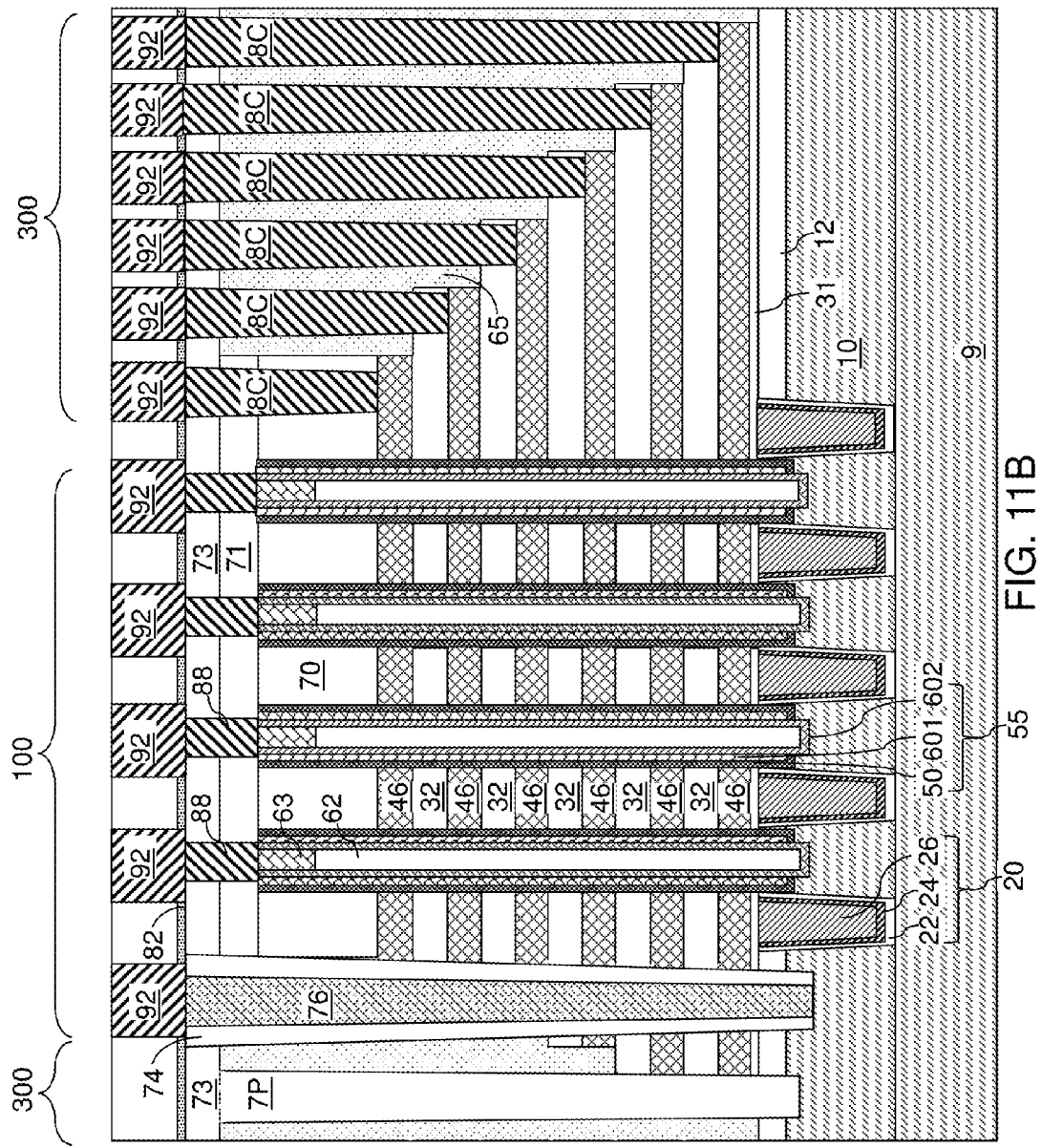

Referring to FIGS. 11A and 11B, an optional passivation layer 82 and a line-level dielectric layer 90 can be formed over the dielectric pillar material layer 73. The optional passivation layer 82 can include a low permeability material such as silicon nitride. The thickness of the passivation layer 82 can be in a range from 3 nm to 30 nm, although lesser and greater thicknesses can also be employed. The line-level dielectric layer 90 can include silicon oxide or organosilicate glass. The thickness of the line-level dielectric layer 90 can be in a range from 30 nm to 1,000 nm, although lesser and greater thicknesses can also be employed. Control gate contact via structures 8C can contact the electrically conductive layers 46.

Various conductive line structures 92 can be formed in the line-level dielectric layer 90 to provide electrical contact to the various contact via structures (76, 8G, 8A, 88, 8C). A subset of the electrically conductive layers 46 can function as control gate electrodes for the memory stack structures 55 in the device region. Optionally, at least one subset of the electrically conductive layers 46 can be employed as at least one drain select gate electrode and/or at least one source select gate electrode.

Additional metal interconnect structures (not shown) can be optionally formed, which can include at least one dielectric material layer, at least one conductive via structure, and at least one additional conductive line structure. The additional metal interconnect structure can be formed on the top surface of the conductive line structure 92 and the line-level dielectric layer 90.

The exemplary structure is a multilevel structure including a stack (32, 46) of an alternating plurality of electrically conductive layers 46 and insulator layers 32 located over a semiconductor substrate including the semiconductor material layer 10. An array of memory stack structures 55 can be located within memory openings through the stack (32, 46).

In one embodiment, the device located on the semiconductor substrate can include a vertical NAND device located in the device region 100, and at least one of the electrically conductive layers 46 in the stack (32, 46) can comprise, or can be electrically connected to, a word line of the NAND device. The device region 100 can include a plurality of semiconductor channels (601, 602). At least one end portion of each of the plurality of semiconductor channels (601, 602) extends substantially perpendicular to a top surface of the semiconductor substrate. The device region 100 further includes a plurality of charge storage regions located within each memory layer 50. Each charge storage region is located adjacent to a respective one of the plurality of semiconductor channels (601, 602). The device region 100 further includes a plurality of control gate electrodes having a strip shape extending substantially parallel to the top surface of the substrate (9, 10). The plurality of control gate electrodes comprise at least a first control gate electrode located in the first device level and a second control gate electrode located in the second device level. The plurality of electrically conductive layers 46 in the stack (32, 46) can be in electrical contact with, or can comprise, the plurality of control gate electrodes, and extends from the device region 100 to a contact region 300 including a plurality of electrically conductive contact via structures.

In case the exemplary structure includes a three-dimensional NAND device, a stack (32, 46) of an alternating plurality of word lines 46 and insulating layers 32 can be located over a semiconductor substrate. Each of the word lines 46 and insulating layers 32 is located at different levels that are vertically spaced from a top surface of the semiconductor substrate by different distances. An array of memory stack structures 55 is embedded within the stack (32, 46). Each memory stack structure 55 comprises a semiconductor channel (601, 602) and at least one charge storage region located adjacent to the semiconductor channel (601, 602). At least one end portion of the semiconductor channel (601, 602) extends substantially perpendicular to the top surface of the semiconductor substrate through the stack (32, 46).

In a non-limiting illustrative example, the insulating layers 32 can comprise silicon oxide layers, the plurality of word lines 46 can comprise tungsten, ruthenium, a combination or an alloy of ruthenium and tungsten, or a combination of titanium nitride, ruthenium, and tungsten, the at least one charge storage region can comprises a tunneling dielectric, a blocking dielectric layer, and either a plurality of floating gates or a charge trapping layer located between the tunneling dielectric layer and the blocking dielectric layer. An end portion of each of the plurality of word lines 46 in a device region can comprise a control gate electrode located adjacent to the at least one charge storage region. A plurality of contact via structures contacting the word lines 46 can be located in a contact region 300. The plurality of word lines 46 extends from the device region 100 to the contact region 300. The backside contact via structure 76 can be a source line that extends through a dielectric insulated trench, i.e., the backside contact trench 79 filled with the dielectric spacer 74 and the backside contact via structure 76, in the stack to electrically contact the source region (not shown). The source region can be in contact with the horizontal portion of the semiconductor channel in an upper portion of the semiconductor material layer 10.

A drain line, as embodied as a conductive line structure 92 that contacts a drain contact via structure 88, electrically contacts an upper portion of the semiconductor channel (601, 602). As used herein, a first element "electrically contacts" a second element if the first element is electrically shorted to the second element. An array of drain regions 63 contacts a respective semiconductor channel (601, 602) within the array of memory stack structures 55. A top surface of the dielectric material layer, i.e., the insulating cap layer 70, can be coplanar with top surfaces of the drain regions 63.

Within the exemplary structure illustrated in FIGS. 11A and 11B, a memory film 50 and a semiconductor channel (601, 602) are located within a memory opening. Each of the electrically conductive layers 46 comprises a ruthenium portion 461 and a conductive material portion 476 comprising a material other than ruthenium. The ruthenium portion 461 is more proximal to the memory film 50 than the conductive material portion 476 is to the memory film 50 as illustrated in FIGS. 6C, 7C, 8C, and 9C in each of the embodiments of the present disclosure. Each ruthenium portion 461 can be located within one level of the stack, and can be disjoined from other ruthenium portions 461 located at any other level of the stack. As used herein, a first element is "disjoined" from a second element if no portion of the first element is in physical contact with the second element. In one embodiment, the conductive material portion 476 can contact a ruthenium portion 461, and does not include silicon or boron therein. In one embodiment, the conductive material portion 476 can consist essentially of tungsten.

In an embodiment illustrated in FIG. 6E, each ruthenium portion 416 contacts an entire bottom surface of an overlying insulator layer 32 and an entire top surface of an underlying insulator layer 32. A vertical portion of the ruthenium portion 461 can have a greater thickness than horizontal portions of the ruthenium portion 461 as illustrated in FIG. 7C.

In embodiments illustrated in FIGS. 7D and 8C, an electrically conductive liner 481 within each electrically conducting layer 46 can contact an entire bottom surface of an overlying insulator layer 32 and an entire top surface of an underlying insulator layer 32.

Figure 12:
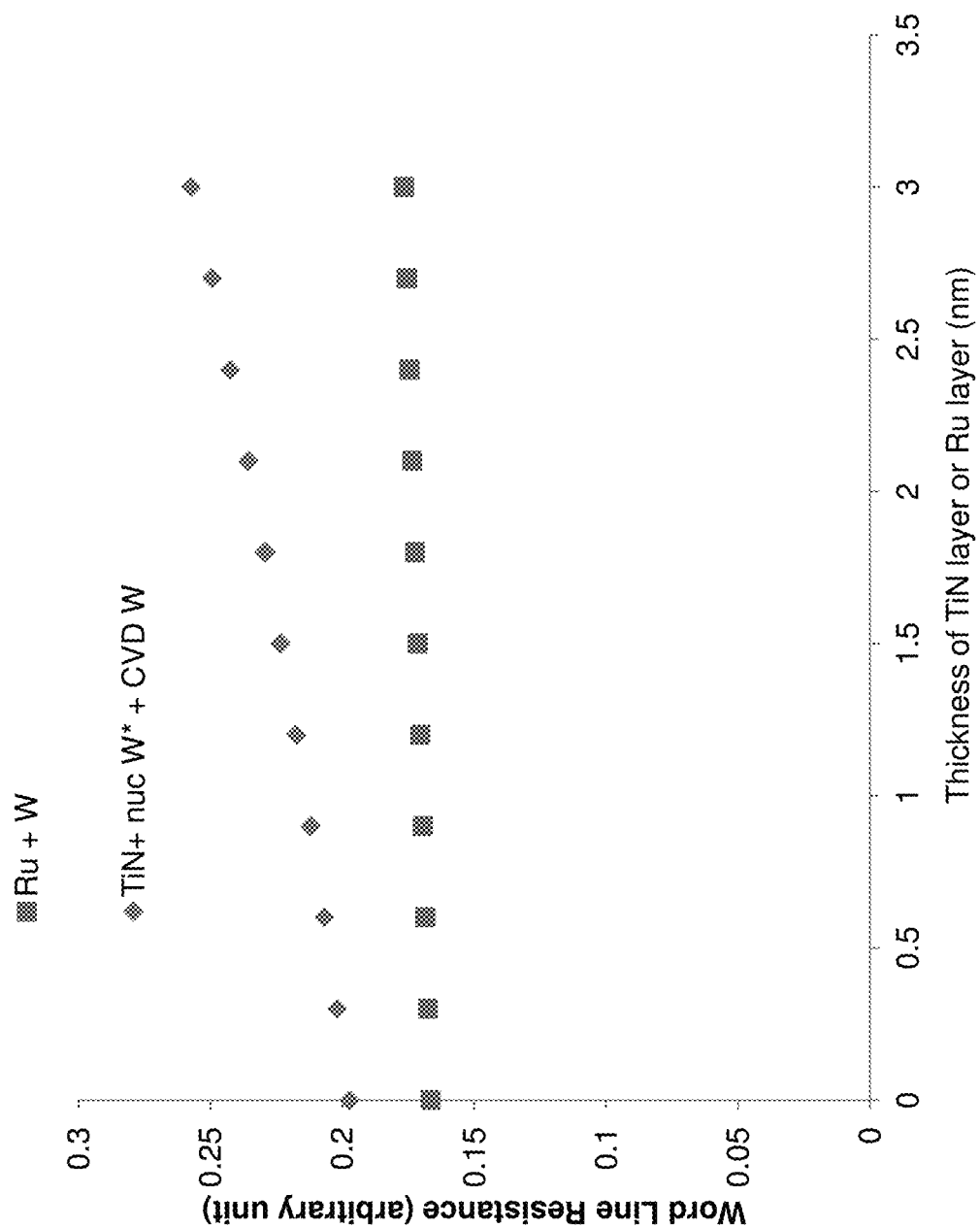
FIG. 12 is a graph of a simulation result that illustrates the dependence of word line resistance as a function of the thickness of a TiN layer in a first-type word line including the TiN liner/silane-reduced amorphous tungsten layer/hydrogen-reduced tungsten layer stack, or as a function of the thickness of a ruthenium layer in a second-type word line including the ruthenium layer/hydrogen-reduced tungsten layer stack.

Referring to FIG. 12, a graph of a simulation result illustrates the advantage of the methods of the present disclosure. Word line resistance is shown as a function of the thickness of a TiN layer in a first-type word line including a TiN liner/a silane-reduced amorphous tungsten nucleation layer (having a thickness of 5 nm)/a hydrogen-reduced tungsten layer stack and labeled as "TiN+nuc W*+CVD W", and as a function of the thickness of a ruthenium layer in a second-type word line including the ruthenium layer/hydrogen-reduced tungsten layer stack and labeled as "Ru+W". For the same thickness of a TiN layer and a Ru layer, the Ru layer provides a lower resistivity while functioning as a seeding layer for the hydrogen-reduced tungsten layer, which is formed as a polycrystalline layer consisting essentially of tungsten. The simulation was performed assuming a backside recess having a height of 30 nm. It is projected that the height of the backside recess will become as small as 20 nm in future generation technologies. For such reduced height of backside recesses, the benefits of the embodiments of the present disclosure in terms of relative resistivity will be even more than illustrated in FIG. 12. That is because a TiN liner will occupy a greater percentage of the word line thickness and will have a higher contribution to resistivity if the height of the backside recess is reduced below 30 nm as assumed in the simulation employed for FIG. 12.

The method of the present disclosure can be employed to lower resistivity in electrically conductive layers. The conventional tungsten deposition process forms a sequential stack of a TiN or WN layer, then a high resistivity, amorphous tungsten nucleation layer derived by reduction of a tungsten-containing precursor in silane, dichlorosilane, or diborane, and then a low resistivity, polycrystalline tungsten layer derived by reduction of a tungsten-containing precursor in hydrogen. Among the three layers, the TiN/WN layer and the amorphous tungsten nucleation layer are high resistivity layers. For the amorphous tungsten nucleation layer, the high resistivity is due partly to presence of boron or silicon therein, and partly to the amorphous phase of the deposited material.

Some embodiments of the present disclosure enable replacement of the combination of a TiN/WN layer and an amorphous tungsten nucleation layer with a single ruthenium layer. The ruthenium material in the ruthenium layer has a lower resistivity than the material of the TiN/WN layer, and lower resistivity than the material of the amorphous tungsten nucleation layer. Thus, use of the ruthenium layer contributes significantly to reduction in the electrical resistance of the electrically conductive layers.

In some other embodiments of the present disclosure, a TiN/WN layer is employed within a conductive material stack, and an amorphous tungsten nucleation layer is replaced with a ruthenium layer. This embodiment may have the benefit of reducing ruthenium diffusion into dielectric materials that the ruthenium layer would contact in the absence of the TiN/WN layer. In this case, replacement of the amorphous tungsten nucleation layer with the ruthenium layer provides the benefit of reduction in the overall resistivity of the electrically conductive layers formed in the backside recesses.

The advantage of the structures of the present disclosure is more apparent when the bulk resistivity values of each layer are compared. Nucleation layers for metal deposition, such as tungsten nucleation layers, can have a higher resistivity than a bulk portion of electrically conductive layers, and lead to a higher resistivity in metal interconnect structures. Titanium nitride has a bulk resistivity of about 100 microOhm-cm, silane-reduced amorphous tungsten has a bulk resistivity of about 50 microOhm-cm, ruthenium deposited by ALD has a bulk resistivity of about 7.1 microOhm-cm, and hydrogen-reduced polycrystalline tungsten has a bulk resistivity of about 5.1 microOhm-cm. Thus, use of a ruthenium layer that can be deposited directly on dielectric material layer can lower the resistivity of a conductive line compared with the combination of a titanium nitride layer and a tungsten seed layer formed by reduction $WF_6$ by silane, dichlorosilane, or diborane.

Figure 13:
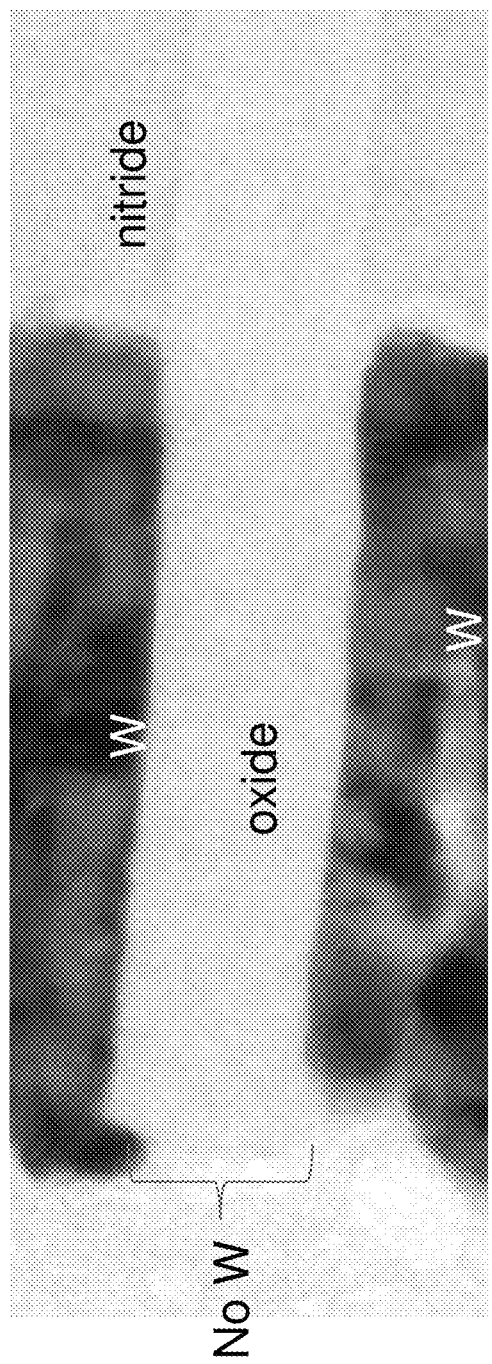
FIG. 13 is a TEM micrograph of selectively deposited tungsten on ruthenium.

FIG. 13 is a transmission electron microscopy (TEM) micrograph which shows that tungsten is selectively deposited by reduction of $WF_6$ in hydrogen directly on a ruthenium liner located in the recess between two horizontal oxide layers and a vertical nitride layer, while not being deposited on exposed silicon oxide layer edge surfaces in the trench. This is verified by energy dispersive analysis of X-rays (EDAX) and by high angle annular dark field (HAADF) scanning transmission electron microscopy.

Another benefit of the embodiments of the present disclosure is that a recess etch of a conductive material deposited in a backside contact trench can be avoided. Because the conductive material (e.g., tungsten) that forms a predominant portion of the electrically conductive layers can be deposited in a selective deposition process, the conductive material does not grow from the sidewalls of the insulator layers 32 exposed in the backside contact trench. For example, because a tungsten deposition process employing reduction of a tungsten halide gas by hydrogen does not deposit any tungsten on dielectric surfaces such as surfaces of silicon oxide layers 32, and proceeds only from surfaces of a ruthenium layer (e.g., ruthenium portions 461 in the back side recesses), tungsten as a conductive material that fills the backside trenches is not deposited directly on the sidewalls of the backside contact trench. Thus, a tungsten etchback process that removes tungsten from inside the backside contact trench can be eliminated according to the embodiment methods of the present disclosure. If anisotropic etch processes are optionally employing according to some embodiments of the present disclosure, such anisotropic etch processes can be employed only to removed ruthenium portions or a combination of ruthenium portions and metallic nitride liner portions (such as TiN/WN). Given that tungsten is a material that is very difficult to etch, and that TiN/WN and ruthenium are easier to etch, the method of the present disclosure provides an easier integration scheme.

Also, the top surface of the alternating stack can be a silicon oxide surface, and deposition of tungsten can be avoided above the alternating stack according to embodiments of the present disclosure. While conventional integration schemes require that excess tungsten material deposited above the alternating stack be removed completely, integration schemes employing the methods of the present disclosure do not require any such removal step because an excess metallic material is not deposited over the alternating stack or on the sidewalls of the insulator layers. Considering that the thickness of deposited tungsten material in conventional integration schemes can be on the order of 40 nm to 50 nm, and that removal of such a thick layer of tungsten requires very careful control of the etch process to insure complete removal of tungsten in order to avoid electrical shorts among word lines located at different levels, the integration scheme of the present disclosure can provide substantive advantage over prior art integration schemes.

Another advantage of absence of deposited tungsten material over the alternating stack and on the sidewalls of the backside contact trench 79 is that warping of the device structure and/or the substrate due to stress generated by the tungsten conductive material over the alternating stack and on the sidewalls of the backside contact trench can be avoided. Severe wafer warpage may occur in the conventional approach in which a sizable amount of tungsten is deposited over the alternating stack and inside the backside contact trench. The level of wafer warpage may even be high enough to make it impossible to carry out the subsequent reactive ion etch (RIE) step to remove the deposited tungsten from above the alternating stack and from inside the backside contact trench since the wafer cannot even be mounted on a chuck in a RIE chamber. In the approach of embodiments of the present disclosure, the deposited conductive material (such as tungsten) is selectively deposited only within the backside recesses, and is not deposited over the alternating stack or on the sidewalls of the backside contact trench. Thus, a mechanism for generating stress and wafer warpage is eliminated through the methods of the present disclosure, thereby ensuring that the processed wafer can move on to the next processing step without becoming unusable due to excessive warpage.

Although the foregoing refers to particular preferred embodiments, it will be understood that the disclosure is not so limited. It will occur to those of ordinary skill in the art that various modifications may be made to the disclosed embodiments and that such modifications are intended to be within the scope of the disclosure. Where an embodiment employing a particular structure and/or configuration is illustrated in the present disclosure, it is understood that the present disclosure may be practiced with any other compatible structures and/or configurations that are functionally equivalent provided that such substitutions are not explicitly forbidden or otherwise known to be impossible to one of ordinary skill in the art. All of the publications, patent applications and patents cited herein are incorporated herein by reference in their entirety.

What is claimed is:

1. A three-dimensional memory device comprising:
    a stack of alternating layers comprising insulator layers and electrically conductive layers and located over a substrate;
    a memory opening extending through the stack; and
    a memory film and a semiconductor channel located within the memory opening, wherein each of the electrically conductive layers comprises a ruthenium portion and a conductive material portion comprising a material other than ruthenium, and the ruthenium portion is more proximal to the memory film than the conductive material portion,
wherein:
a first sidewall of the ruthenium portion contacts a portion of an outer sidewall of the memory film; and
a second sidewall of the ruthenium portion contacts an inner sidewall of the conductive material portion.

2. The three-dimensional memory device of claim 1, wherein the electrically conductive layers comprise:
a first control gate electrode located in a first device level; and
a second control gate electrode located in a second device level that is located below the first device level.

3. The three-dimensional memory device of claim 1, wherein the first sidewall of the ruthenium portion laterally surrounds, and encloses, the memory film.

4. The three-dimensional memory device of claim 1, wherein the conductive material portion is spaced from the insulators and the memory film by the ruthenium portion.

5. The three-dimensional memory device of claim 4, wherein a vertical portion of the ruthenium portion has a greater thickness than horizontal portions of the ruthenium portion.

6. The three-dimensional memory device of claim 4, wherein a vertical portion of the ruthenium portion has a same thickness as horizontal portions of the ruthenium portion.

7. The three-dimensional memory device of claim 4, further comprising an electrically conductive liner contacting an entire bottom surface of an overlying insulator layer and an entire top surface of an underlying insulator layer.

8. The three-dimensional memory device of claim 1, wherein each ruthenium portion is located within one level of the stack, and is disjoined from other ruthenium portions located at any other level of the stack.

9. The three-dimensional memory device of claim 1, wherein the conductive material portion is spaced from an overlying insulator layer and is spaced from an underlying insulator layer.

10. The three-dimensional memory device of claim 1, wherein the ruthenium portion has a uniform thickness at a vertical portion thereof, the uniform thickness being selected from a range from 3 nm to 10 nm.

11. The three-dimensional memory device of claim 1, wherein the conductive material portion comprises tungsten.

12. The three-dimensional memory device of claim 1, wherein the memory film comprises a stack including a blocking dielectric, at least one charge storage element, and a tunneling dielectric.

13. The three-dimensional memory device of claim 1, wherein the conductive material portion contacts the ruthenium portion, and does not include silicon or boron therein.

14. The three-dimensional memory device of claim 1, wherein:
the three-dimensional memory device comprises a vertical NAND device located in a device region; and
the electrically conductive layers comprise, or are electrically connected to a respective word line of the NAND device.

15. The three-dimensional memory device of claim 14, wherein:
the device region comprises:
a plurality of semiconductor channels, wherein at least one end portion of each of the plurality of semiconductor channels extends substantially perpendicular to a top surface of the substrate;
a plurality of charge storage regions, each charge storage region located adjacent to a respective one of the plurality of semiconductor channels; and
a plurality of control gate electrodes having a strip shape extending substantially parallel to the top surface of the substrate;
the plurality of control gate electrodes comprise at least a first control gate electrode located in a first device level and a second control gate electrode located in a second device level;
the electrically conductive layers in the stack are in electrical contact with the plurality of control gate electrode and extend from the device region to a contact region including the plurality of electrically conductive via connections; and
the substrate comprises a silicon substrate containing a driver circuit for the NAND device.

16. A three-dimensional memory device comprising:
a stack of alternating layers comprising insulator layers and electrically conductive layers and located over a substrate;
a memory opening extending through the stack; and
a memory film and a semiconductor channel located within the memory opening, wherein each of the electrically conductive layers comprises a ruthenium portion and a conductive material portion comprising a material other than ruthenium, and the ruthenium portion is more proximal to the memory film than the conductive material portion,
wherein:
a first sidewall of the ruthenium portion contacts a portion of an outer sidewall of the memory film; and
the first sidewall of the ruthenium portion laterally surrounds, and encloses, the memory film.

17. The three-dimensional memory device of claim 16, wherein the electrically conductive layers comprise:
a first control gate electrode located in a first device level; and
a second control gate electrode located in a second device level that is located below the first device level.

18. The three-dimensional memory device of claim 16, wherein a second sidewall of the ruthenium portion contacts an inner sidewall of the conductive material portion.

19. The three-dimensional memory device of claim 16, wherein the conductive material portion is spaced from the insulators and the memory film by the ruthenium portion.

20. The three-dimensional memory device of claim 19, wherein a vertical portion of the ruthenium portion has a greater thickness than horizontal portions of the ruthenium portion.

21. The three-dimensional memory device of claim 19, wherein a vertical portion of the ruthenium portion has a same thickness as horizontal portions of the ruthenium portion.

22. The three-dimensional memory device of claim 19, further comprising an electrically conductive liner contacting an entire bottom surface of an overlying insulator layer and an entire top surface of an underlying insulator layer.

23. The three-dimensional memory device of claim 16, wherein each ruthenium portion is located within one level of the stack, and is disjoined from other ruthenium portions located at any other level of the stack.

24. The three-dimensional memory device of claim 16, wherein the conductive material portion is spaced from an overlying insulator layer, and is spaced from an underlying insulator layer.

25. The three-dimensional memory device of claim 16, wherein the ruthenium portion has a uniform thickness at a vertical portion thereof, the uniform thickness being selected from a range from 3 nm to 10 nm.

26. The three-dimensional memory device of claim 16, wherein the conductive material portion comprises tungsten.

27. The three-dimensional memory device of claim 16, wherein the memory film comprises a stack including a blocking dielectric, at least one charge storage element, and a tunneling dielectric.

28. The three-dimensional memory device of claim 16, wherein the conductive material portion contacts the ruthenium portion, and does not include silicon or boron therein.

29. The three-dimensional memory device of claim 16, wherein:
the three-dimensional memory device comprises a vertical NAND device located in a device region; and
the electrically conductive layers comprise, or are electrically connected to a respective word line of the NAND device.

30. The three-dimensional memory device of claim 29, wherein:
the device region comprises:
a plurality of semiconductor channels, wherein at least one end portion of each of the plurality of semiconductor channels extends substantially perpendicular to a top surface of the substrate;
a plurality of charge storage regions, each charge storage region located adjacent to a respective one of the plurality of semiconductor channels; and
a plurality of control gate electrodes having a strip shape extending substantially parallel to the top surface of the substrate;
the plurality of control gate electrodes comprise at least a first control gate electrode located in a first device level and a second control gate electrode located in a second device level;
the electrically conductive layers in the stack are in electrical contact with the plurality of control gate electrode and extend from the device region to a contact region including the plurality of electrically conductive via connections; and
the substrate comprises a silicon substrate containing a driver circuit for the NAND device.

* * * * *